United States Patent
Lee et al.

(10) Patent No.: US 12,014,988 B2
(45) Date of Patent: Jun. 18, 2024

(54) SEMICONDUCTOR DEVICE HAVING A GRAPHENE FILM AND METHOD FOR FABRICATING THEREOF

(71) Applicant: Samsung Electronics Co., Ltd., Suwon-si (KR)

(72) Inventors: Jang Eun Lee, Hwaseong-si (KR); Min Joo Lee, Seoul (KR); Wan Don Kim, Seongnam-si (KR); Hyun Bae Lee, Seoul (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 311 days.

(21) Appl. No.: 17/358,752

(22) Filed: Jun. 25, 2021

(65) Prior Publication Data

US 2022/0013467 A1    Jan. 13, 2022

(30) Foreign Application Priority Data

Jul. 13, 2020   (KR) ........................ 10-2020-0085970

(51) Int. Cl.
*H01L 23/532*   (2006.01)
*H01L 23/522*   (2006.01)
*H01L 23/528*   (2006.01)

(52) U.S. Cl.
CPC .... *H01L 23/53266* (2013.01); *H01L 23/5226* (2013.01); *H01L 23/5286* (2013.01); *H01L 23/53238* (2013.01); *H01L 23/53252* (2013.01)

(58) Field of Classification Search
CPC ......... H01L 23/53266; H01L 23/53238; H01L 23/53252; H01L 23/5226; H01L 23/5286
See application file for complete search history.

(56) References Cited

U.S. PATENT DOCUMENTS

| | | |
|---|---|---|
| 6,277,722 B1 | 8/2001 | Lee et al. |
| 6,503,792 B2 | 1/2003 | Hartner et al. |
| 8,895,433 B2 | 11/2014 | Bonilla et al. |
| 9,177,781 B2 | 11/2015 | Tahara et al. |
| 9,202,743 B2 | 12/2015 | Bao et al. |
| 9,613,854 B2 | 4/2017 | Yang et al. |
| 9,929,096 B2 | 3/2018 | Zhou |

(Continued)

FOREIGN PATENT DOCUMENTS

| | | |
|---|---|---|
| KR | 20050000894 A | 1/2005 |
| KR | 20050025820 A | 3/2005 |

*Primary Examiner* — Laura M Menz
*Assistant Examiner* — Candice Chan
(74) *Attorney, Agent, or Firm* — Muir Patent Law, PLLC

(57) ABSTRACT

A semiconductor device and a method for fabricating the same. The semiconductor device comprising: a first level wiring disposed at a first metal level, and includes a first line wiring, a first insulating capping film and a first side wall graphene film, the first insulating capping film extending along an upper surface of the first line wiring, and the first side wall graphene film extending along a side wall of the first line wiring; an interlayer insulating film covering the side wall of the first line wiring and a side wall of the first insulating capping film; and a second level wiring disposed at a second metal level higher than the first metal level, and includes a second via connected to the first line wiring, and a second line wiring connected to the second via, wherein the second via penetrates the first insulating capping film.

19 Claims, 31 Drawing Sheets

(56) References Cited

U.S. PATENT DOCUMENTS

| | | |
|---|---|---|
| 10,319,632 B2 | 6/2019 | Yang et al. |
| 10,510,657 B2 | 12/2019 | Yang et al. |
| 10,522,749 B2 | 12/2019 | Shen et al. |
| 10,553,762 B2 | 2/2020 | Xie et al. |
| 2006/0068535 A1 | 3/2006 | Youn et al. |
| 2017/0278867 A1 | 9/2017 | Jeong et al. |
| 2018/0350913 A1* | 12/2018 | Yang ............... H01L 21/76879 |
| 2020/0098685 A1* | 3/2020 | Lee ................. H01L 21/76892 |
| 2020/0243383 A1* | 7/2020 | Huang ............. H01L 23/53252 |
| 2021/0118693 A1* | 4/2021 | Joy ................. H01L 21/76805 |
| 2023/0245924 A1* | 8/2023 | Narkeviciute ......... H01L 21/32 257/760 |

* cited by examiner

US 12,014,988 B2

SEMICONDUCTOR DEVICE HAVING A GRAPHENE FILM AND METHOD FOR FABRICATING THEREOF

CROSS-REFERENCE TO RELATED APPLICATION

This application claims priority from Korean Patent Application No. 10-2020-0085970, filed on Jul. 13, 2020, in the Korean Intellectual Property Office, and all the benefits accruing therefrom under 35 U.S.C. § 119, the contents of which in its entirety are herein incorporated by reference.

BACKGROUND

1. Technical Field

The present disclosure relates to a semiconductor device and a method for fabricating thereof, and more specifically, to a semiconductor device including a wiring line formed in a BEOL (Back-End-Of-Line) process and a method for fabricating thereof.

2. Description of the Related Art

With the recent progress of down-scaling of semiconductor devices due to the development of electronic technology, a high integration and a low power consumption of semiconductor chips are required. In order to cope with the requirements for high integration and lower power consumption of the semiconductor chips, the feature sizes of semiconductor devices are continuously decreasing.

As various contact forms are used for connection between the wirings, a length of a contact may increase. This may lead to an increase in contact resistance.

SUMMARY

Aspects of the present disclosure provide a semiconductor device capable of improving the performance and reliability of a device by forming a protective film on a wiring line.

Aspects of the present disclosure also provide a method for fabricating a semiconductor device capable of improving the performance and reliability of a device by forming a protective film on a wiring line.

According to an aspect of the present inventive concept, there is provided a semiconductor device comprising: a first level wiring disposed at a first metal level, the first level wiring including a first line wiring, a first insulating capping film, and a first side wall graphene film, the first insulating capping film extending along an upper surface of the first line wiring, and the first side wall graphene film extending along a side wall of the first line wiring; an interlayer insulating film which covers the side wall of the first line wiring and a side wall of the first insulating capping film; and a second level wiring first level wiring at a second metal level higher than the first metal level, the second level wiring including a second via connected to the first line wiring, and a second line wiring connected to the second via, wherein the second via penetrates the first insulating capping film.

According to an aspect of the present inventive concept, there is provided a semiconductor device comprising: a first level wiring disposed at a first metal level, the first level wiring including a first line wiring, a first side wall graphene film, and a first bottom graphene film, the first bottom graphene film extending along a bottom surface of the first line wiring, and the first side wall graphene film extending along a side wall of the first line wiring; and a second level wiring disposed at a second metal level higher than the first metal level, the second level wiring including a second via connected to the first line wiring, and a second line wiring connected to the second via, wherein a thickness of the first side wall graphene film is greater than a thickness of the first bottom graphene film.

According to an aspect of the present inventive concept, there is provided a semiconductor device comprising: a first level wiring disposed at a first metal level, the first level wiring including a first ruthenium line wiring, a first insulating capping film, a first side wall graphene film, and a first bottom graphene film, the first insulating capping film extending along an upper surface of the first ruthenium line wiring, the first side wall graphene film extending along a side wall of the first ruthenium line wiring, and the first bottom graphene film extending along a bottom surface of the first ruthenium line wiring; an interlayer insulating film which covers a side wall of the first line wiring and a side wall of the first insulating capping film; and a second level wiring disposed at a second metal level higher than the first metal level, the second level wiring including a second via penetrating the first insulating capping film and connected to the first ruthenium line wiring, and a second line wiring connected to the second via.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which like numbers refer to like elements throughout. In the drawings.

DETAILED DESCRIPTION OF THE EMBODIMENTS

Although drawings of a semiconductor device according to example embodiments show a fin type transistor (FinFET) including a fin-type patterned channel region, and a transistor including a nanowire or a nanosheet, the present disclosure is not limited thereto. A technical idea of the present disclosure may be applied to a two-dimensional material-based transistor (2D material based FETs) and a heterostructure thereof.

Also, the semiconductor device according to example embodiments may include a tunneling FET or a three-dimensional (3D) transistor. The semiconductor device according to example embodiments may also include a bipolar junction transistor, a laterally-diffused metal-oxide semiconductor (LDMOS), and the like.

Figure 1:
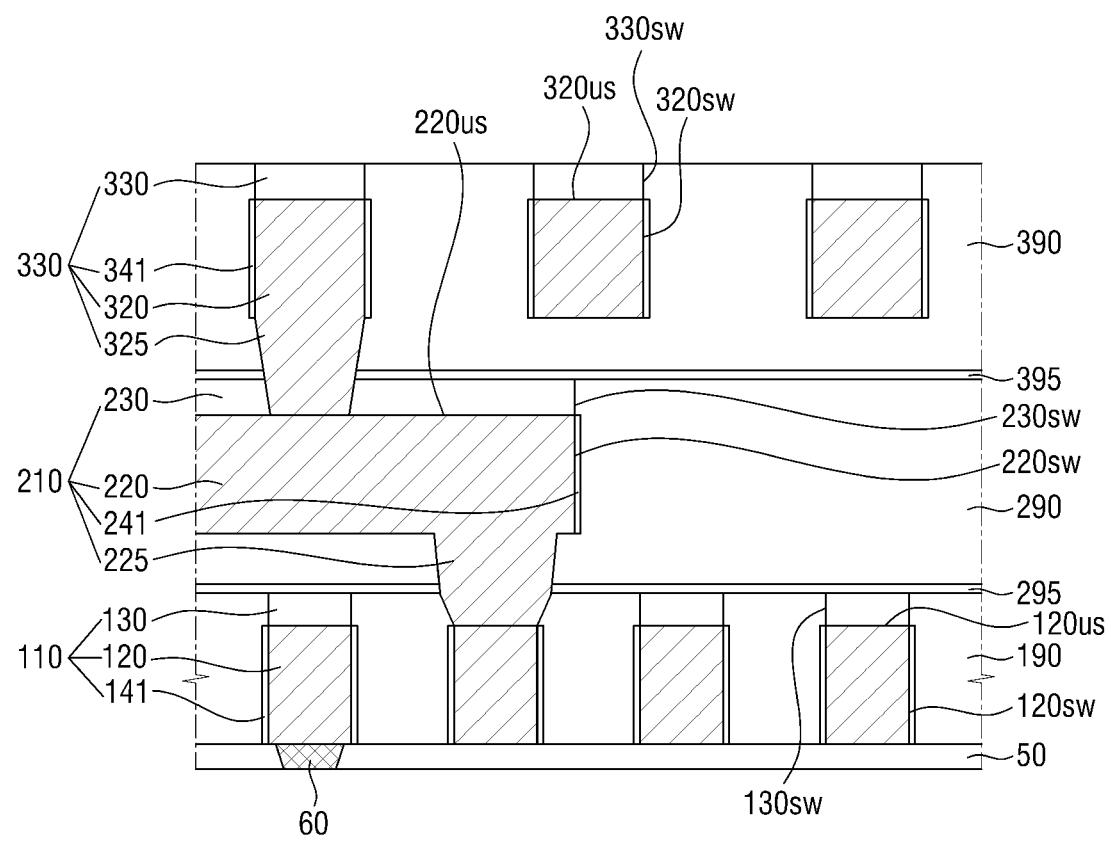
FIG. 1 is a diagram for explaining a semiconductor device, according to example embodiments.

FIG. 1 is a diagram for explaining a semiconductor device, according to example embodiments.

Referring to FIG. 1, the semiconductor device according to example embodiments may include a lower conductive pattern 60, a first level wiring 110, a second level wiring 210, and a third level wiring 310.

The lower conductive pattern 60 may be disposed inside a lower interlayer insulating film 50. Although the lower conductive pattern 60 is shown as a single film, this is only for convenience of explanation, and the embodiment is not limited thereto. Unlike the illustrated example, the lower conductive pattern 60 may include a filling film, and a barrier film extending along side walls and a bottom surface of the filling film.

The lower interlayer insulating film 50 may cover the gate electrode and the source/drain of the transistor formed in the FEOL (Front-end-of-Line) process. Or, in some embodiments, the lower interlayer insulating film 50 may be an interlayer insulating film formed in the BEOL (Back-end-of-line) process.

In other words, as an example, the lower conductive pattern 60 may be a contact or a contact wiring formed in the MOL (Middle-of-Line) process. As another example, the lower conductive pattern 60 may be a connection wiring formed in the BEOL process.

The lower interlayer insulating film 50 may include, for example, at least one of silicon oxide, silicon nitride, silicon oxynitride, and a low dielectric constant material. The low dielectric constant material may be, for example, a silicon oxide having suitably high carbon and hydrogen, and may be a material such as SiCOH. On the other hand, since carbon is included in the insulating material, the dielectric constant of the insulating material may be lowered. However, in order to further lower the dielectric constant of the insulating material, the insulating material may include a pore such as a cavity in which gas or air is filled inside the insulating material.

The low dielectric constant material may include, for example, but is not limited to, Fluorinated TetraEthylOrtho-Silicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first level wiring 110 may be disposed at a first metal level. The first level wiring 110 may be disposed on the lower interlayer insulating film 50. The first level wiring 110 may be connected to the lower conductive pattern 60.

The first level wiring 110 may include a first line wiring 120, a first insulating capping film 130, and a first side wall graphene film 141.

The first line wiring 120 may extend lengthwise in a second direction D2. The first line wiring 120 may have a line shape extending in the second direction D2. For example, a first direction D1 may be a width direction of the first line wiring 120, and the second direction D2 may be a length direction of the first line wiring 120. Here, the first direction D1 intersects the second direction D2 and a third direction D3. The second direction D2 intersects the third direction D3. An item, layer, or portion of an item or layer described as extending "lengthwise" in a particular direction has a length in the particular direction and a width perpendicular to that direction, where the length is greater than the width.

The first line wiring 120 may extend along an upper surface of the lower interlayer insulating film 50. For example, a lower surface of the first line wiring 120 may be in contact with the upper surface of the lower interlayer insulating film 50. As used herein, the term "contact" refers to direct contact (i.e., touching) unless the context indicates otherwise.

Although a width of the first line wiring 120 in the first direction D1 is shown to be constant as it moves along the third direction D3, the present disclosure is not limited thereto. Unlike the illustrated example, the width of the first line wiring 120 in the first direction D1 may decrease as it goes away from the lower interlayer insulating film 50 in the third direction D3. At this time, the width of the first line wiring 120 in the second direction D2 may also decrease as it goes away from the lower interlayer insulating film 50 in the third direction D3.

The first insulating capping film 130 may be disposed on the first line wiring 120. The first insulating capping film 130 may extend along an upper surface 120us of the first line wiring.

Side walls 130sw of the first insulating capping film 130 may be aligned with side walls 120sw of the first line wiring 120. In the semiconductor device according to example embodiments, the first insulating capping film 130 may be in contact with the first line wiring 120.

The first side wall graphene film 141 may be disposed on the side walls 120sw of the first line wiring. The first side wall graphene film 141 may extend along the side walls 120sw of the first line wiring. In example embodiments, upper surfaces of the first side wall graphene film 141 and the first line wiring 120 may be at the same vertical height (e.g., in the third direction D3). For example, upper surfaces of the first side wall graphene film 141 and the first line wiring 120 may be coplanar with one another.

The first side wall graphene film 141 may not be formed on the side walls 130sw of the first insulating capping film. The first side wall graphene film 141 may not extend along the side walls 130sw of the first insulating capping film.

The first side wall graphene film 141 may be in contact with the side walls 120sw of the first line wiring 120. When electrons moving inside the first line wiring 120 collide with the side walls 120sw of the first line wiring 120, the first side wall graphene film 141 may provide specular reflection of electrons from the side walls 120sw of the first line wiring 120.

The first insulating capping film 130 may include, for example, an insulating material. The first insulating capping film 130 may include at least one of silicon oxide, silicon nitride, silicon oxynitride, and silicon carbonitride.

The first side wall graphene film 141 may include graphene.

With down-scaling of the semiconductor device, a width of the wiring in the width direction ( ) may decrease. Hereinafter, the width of the wiring in the width direction may be referred to as a wiring width.

In general, when a material having a large electron mean free path (eMFP) while having a low bulk resistivity is used for the wiring, performance improvement of the semiconductor device may be improved. However, if the width of the wiring is smaller than or equal to 12 nm, when a material having a large eMFP is used for the wiring, the resistance of the wiring may increase. If the width of the wiring decreases, the number of times of collision of electrons in the material having a large eMFP with the surface of the wiring may increase. Due to the increase in the number of times of collision, the resistance of the wiring increases and the performance of the semiconductor device may deteriorate.

With down-scaling of the semiconductor device, the width of wiring of BEOL wiring is also reduced. In order to improve the performance of the semiconductor device, a material having a small bulk resistivity while having small eMFP is required to be used for the BEOL wiring.

For example, the first line wiring 120 may include at least one of ruthenium (Ru), rhodium (Rh), iridium (Ir), molybdenum (Mo), RuAl, NiAl, $NbB_2$, $MoB_2$, $TaB_2$, $V_2AlC$ and $CrAlC$. In the semiconductor device according to example embodiments, the first line wiring 120 may include ruthenium. For example, the first line wiring 120 may be ruthenium line wiring.

The first interlayer insulating film 190 may be disposed on the lower interlayer insulating film 50. The first interlayer insulating film 190 may surround the first level wiring 110.

The first interlayer insulating film 190 may cover the side walls 120sw of the first line wiring 120, the side walls 130sw of the first insulating capping film 130, and upper and side surfaces of the first side wall graphene film 141. The first interlayer insulating film 190 may contact the side walls 130sw of the first insulating capping film 130 and the upper and side surfaces of the first side wall graphene film 141. Upper surfaces of the first interlayer insulating film 190 and the first insulating capping film 130 may be coplanar with one another. For example, the upper surface of the first interlayer insulating film 190 may be disposed on the same plane as the upper surface of the first insulating capping film 130.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first interlayer insulating film 190 may include, for example, at least one of silicon oxide, silicon nitride, silicon oxynitride, and a low dielectric constant material.

A second etching stop film 295 may be disposed on the first interlayer insulating film 190. The second etching stop film 295 may extend along the upper surface of the first interlayer insulating film 190 and the upper surface of the first insulating capping film 130. The second etching stop film 295 may contact the upper surfaces of the first interlayer insulating film 190 and the first insulating capping film 130.

The second etching stop film 295 may include at least one of silicon nitride, silicon carbonitride, silicon oxycarbide, silicon oxynitride, silicon oxide, and silicon oxycarbonitride.

The second level wiring 210 may be disposed at a second metal level different from the first metal level. The second level wiring 210 may be disposed at the second metal level higher than the first metal level. The second level wiring 210 disposed at the second metal level may be connected to the first level wiring 110 disposed at the first metal level.

The second level wiring 210 may include a second line wiring 220, a second via 225, a second insulating capping film 230, and a second side wall graphene film 241.

The second line wiring 220 may extend lengthwise in the first direction D1. The second line wiring 220 may have a line shape extending in the first direction D1.

The second via 225 may be disposed between the second line wiring 220 and the first line wiring 120. The second via 225 may be connected to the first line wiring 120 and the second line wiring 220. The second via 225 may have a contact shape.

The second via 225 may penetrate the second etching stop film 295 and the first insulating capping film 130. A part of the second via 225 may be disposed below the upper surface of the first interlayer insulating film 190. The second via 225 may contact the upper surface 120us of the first line wiring 120.

The second via 225 may be directly connected to the second line wiring 220. For example, the second via 225 and the second line wiring 220 may have an integral structure. The second via 225 and the second line wiring 220 may be formed at once through the same fabricating process. For example, the second via 225 and the second line wiring 220 may be formed at the same time and of the same material, without a break in the continuity of the material of which they are formed.

Although the width of the second line wiring 220 in the first direction D1 is shown to be constant as it moves along the third direction D3, the present disclosure is not limited thereto. Unlike the illustrated example, as the second line wiring 220 goes away from the second etching stop film 295 in the third direction D3, the width of the second line wiring 220 in the first direction D1 may decrease. At this time, as the second line wiring 220 goes away from the second etching stop film 295 in the third direction D3, the width of the second line wiring 220 in the second direction D2 may also decrease in the third direction D3.

Although the width of the second via 225 in the first direction D1 is shown to increase as it goes away from the first line wiring 120, the present disclosure is not limited thereto. Unlike the illustrated example, the width of the second via 225 in the first direction D1 may be constant in the third direction D3.

The second insulating capping film 230 may be disposed on the second line wiring 220. The second insulating capping film 230 may extend along an upper surface 220us of the second line wiring 220.

The side wall 230sw of the second insulating capping film 230 may be aligned with the side wall 220sw of the second line wiring 220. In the semiconductor device according to example embodiments, the second insulating capping film 230 may be in contact with the second line wiring 220. For example, the second insulating capping film 230 may contact the upper surface 220us of the second line wiring 220.

The second side wall graphene film 241 may be disposed on the side wall 220sw of the second line wiring 220, contacting the side wall 220sw of the second line wiring 220. The second side wall graphene film 241 may extend along the side wall 220sw of the second line wiring. In example embodiments, upper surfaces of the second side wall graphene film 241 and the second line wiring 220 may be at the same vertical height (e.g., in the third direction D3). For example, the upper surfaces of the second side wall graphene film 241 and the second line wiring 220 may be coplanar with one another.

The second side wall graphene film 241 may not be formed on the side wall 230sw of the second insulating capping film 230. The second side wall graphene film 241 may not extend along the side wall 230sw of the second insulating capping film 230.

The second insulating capping film 230 may include at least one of silicon oxide, silicon nitride, silicon oxynitride, and silicon carbonitride. The second side wall graphene film 241 may include graphene.

The second line wiring 220 and the second via 225 may include at least one of ruthenium (Ru), rhodium (Rh), iridium (Ir), molybdenum (Mo), RuAl, NiAl, NbB$_2$, MoB$_2$, TaB$_2$, V$_2$AlC and CrAlC. In the semiconductor device according to example embodiments, the second line wiring 220 and the second via 225 may include ruthenium. For example, the second line wiring 220 may be a ruthenium line wiring, and the second via 225 may be a ruthenium via.

A second interlayer insulating film 290 may be disposed on the second etching stop film 295. The second interlayer insulating film 290 may surround the second level wiring 210.

The second interlayer insulating film 290 may cover the side wall 220sw of the second line wiring 220, the side wall 230sw of the second insulating capping film 230, and upper and side surfaces of the second side wall graphene film 241. The second interlayer insulating film 290 may surround a part of the second via 225. The second interlayer insulating film 290 may contact the side wall 220sw of the second line wiring 220, the side wall 230sw of the second insulating capping film 230, the second side wall graphene film 241, and the part of the second via 225. For example, the upper surface of the second interlayer insulating film 290 may be disposed on the same plane as the upper surface of the second insulating capping film 230.

The second interlayer insulating film 290 may include at least one of silicon oxide, silicon nitride, silicon oxynitride and a low dielectric constant material.

A third etching stop film 395 may be disposed on the second interlayer insulating film 290. The third etching stop film 395 may extend along the upper surface of the second interlayer insulating film 290 and the upper surface of the second insulating capping film 230. The third etching stop film 395 may contact the upper surfaces of the second interlayer insulating film 290 and the second insulating capping film 230.

The third etching stop film 395 may include at least one of silicon nitride, silicon carbonitride, silicon oxycarbide, silicon oxynitride, silicon oxide, and silicon oxycarbonitride.

The third level wiring 310 may be disposed at a third metal level different from the second metal level. The third level wiring 310 may be disposed at the third metal level higher than the second metal level. The third level wiring 310 disposed at the third metal level may be connected to the second level wiring 210 disposed at the second metal level.

The third level wiring 310 may include a third line wiring 320, a third via 325, a third insulating capping film 330, and a third side wall graphene film 341.

The third line wiring 320 may extend lengthwise in the second direction D2. The third line wiring 320 may have a line shape extending in the second direction D2.

The third via 325 may be disposed between the third line wiring 320 and the second line wiring 220. The third via 325 may be connected to the second line wiring 220 and the third line wiring 320. The third via 325 may have a contact shape.

The third via 325 may penetrate the third etching stop film 395 and the second insulating capping film 230. A part of the third via 325 may be disposed below the upper surface of the second interlayer insulating film 290. The third via 325 may contact the upper surface 220us of the second wiring line 220.

The third via 325 may be directly connected to the third line wiring 320. For example, the third via 325 and the third line wiring 320 may have an integral structure. The third via 325 and the third line wiring 320 may be formed at once through the same fabricating process. For example, the third via 325 and the third line wiring 320 may be formed at the same time and of the same material, without a break in the continuity of the material of which they are formed.

Although the width of the third line wiring 320 in the first direction D1 is shown to be constant as it moves along the third direction D3, the present disclosure is not limited thereto. Unlike the illustrated example, the width of the third line wiring 320 in the first direction D1 may decrease as the third line wiring 320 goes away from the third etching stop film 395 in the third direction D3. At this time, the width of the third line wiring 320 in the second direction D2 may also decrease as the third line wiring 320 goes away from the third etching stop film 395 in the third direction D3.

Although the width of the third via 325 in the first direction D1 is shown to increase as the third via 325 goes away from the second line wiring 220 in the third direction D3, the present disclosure is not limited thereto. Unlike the illustrated example, the width of the third via 325 in the first direction D1 may be constant in the third direction D3.

The third insulating capping film 330 may be disposed on the third line wiring 320. The third insulating capping film 330 may extend along an upper surface 320us of the third line wiring 320. The third insulating capping film 330 may contact the upper surface 320us of the third line wiring 320.

Side walls 330sw of the third insulating capping film 330 may be aligned with side walls 320sw of the third line wiring 320. In the semiconductor device according to example embodiments, the third insulating capping film 330 may be in contact with the third line wiring 320.

The third side wall graphene film 341 may be disposed on the side walls 320*sw* of the third line wiring 320, contacting the side walls 320*sw* of the third line wiring 320. The third side wall graphene film 341 may extend along the side walls 320*sw* of the third line wiring 320. In example embodiments, upper surfaces of the third side wall graphene film 341 and the third line wiring 320 may be at the same vertical height (e.g., in the third direction D3). For example, the upper surfaces of the third side wall graphene film 341 and the third line wiring 320 may be coplanar with one another.

Third side wall graphene film 341 may not be formed on the side walls 330*sw* of the third insulating capping film 330. Third side wall graphene film 341 may not extend along the side walls 330*sw* of the third insulating capping film 330.

The third insulating capping film 330 may include at least one of silicon oxide, silicon nitride, silicon oxynitride, and silicon carbonitride. The third side wall graphene film 341 may include graphene.

The third line wiring 320 and the third via 325 may include at least one of ruthenium (Ru), rhodium (Rh), iridium (Ir), molybdenum (Mo), RuAl, NiAl, $NbB_2$, $MoB_2$, $TaB_2$, $V_2AlC$ and CrAlC. In the semiconductor device according to example embodiments, the third line wiring 320 and the third via 325 may include ruthenium. For example, the third line wiring 320 may be a ruthenium line wiring, and the third via 325 may be a ruthenium via.

A third interlayer insulating film 390 may be disposed on the third etching stop film 395. The third interlayer insulating film 390 may surround the third level wiring 310.

The third interlayer insulating film 390 may cover the side walls 320*sw* of the third line wiring 320, the side walls 330*sw* of the third insulating capping film 330, and the upper and side surfaces of the third side wall graphene film 341. The third interlayer insulating film 390 may surround a part of the third via 325. The third interlayer insulating film 390 may contact the side walls 320*sw* of the third line wiring 320, the side walls 330*sw* of the third insulating capping film 330, the upper and side surfaces of the third side wall graphene film 341, and the part of the third via 325. For example, the upper surface of the third interlayer insulating film 390 may be disposed on the same plane as the upper surface of the third insulating capping film 330.

The third interlayer insulating film 390 may include, for example, at least one of silicon oxide, silicon nitride, silicon oxynitride, and a low dielectric constant material.

For example, the first to third level wirings 110, 210, and 310 may be formed through an etching process using a mask pattern.

Figure 2:
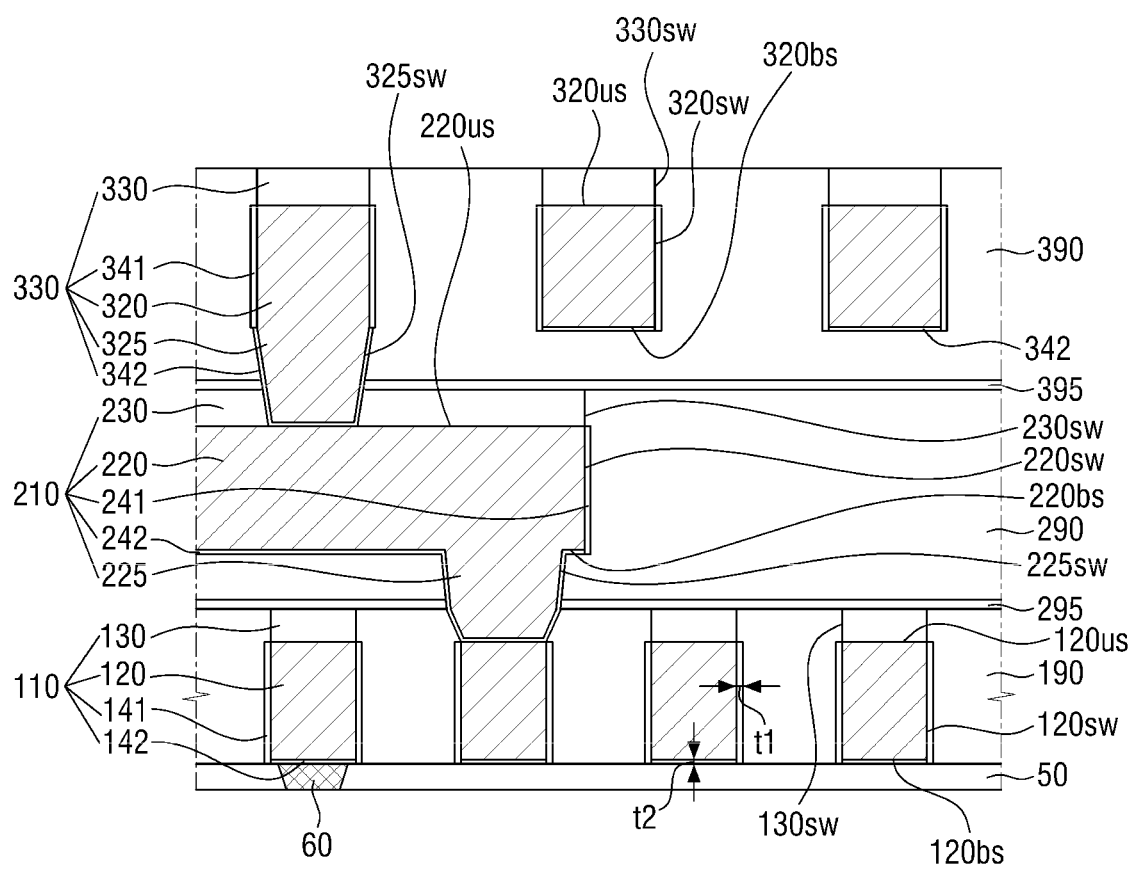
FIGS. 2 to 4 are diagrams for explaining a semiconductor device, according to example embodiments, respectively.
Figure 3:
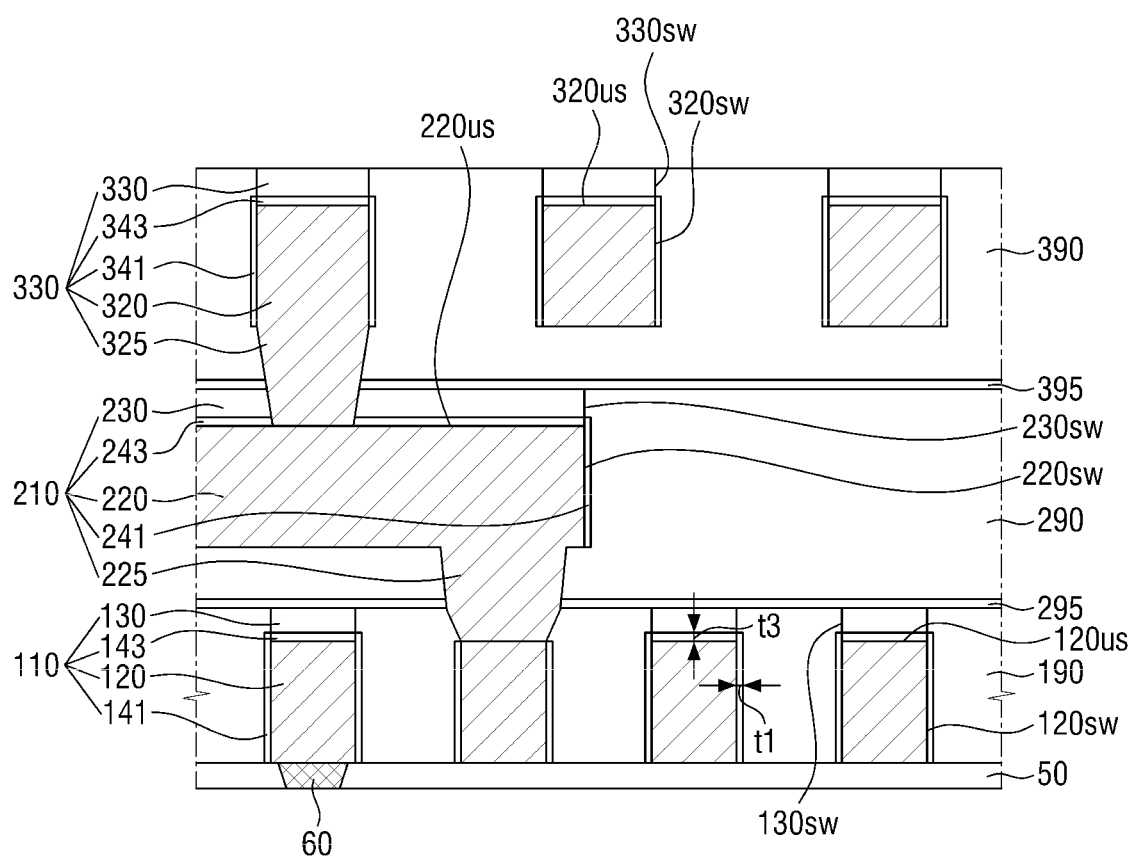
Figure 4:
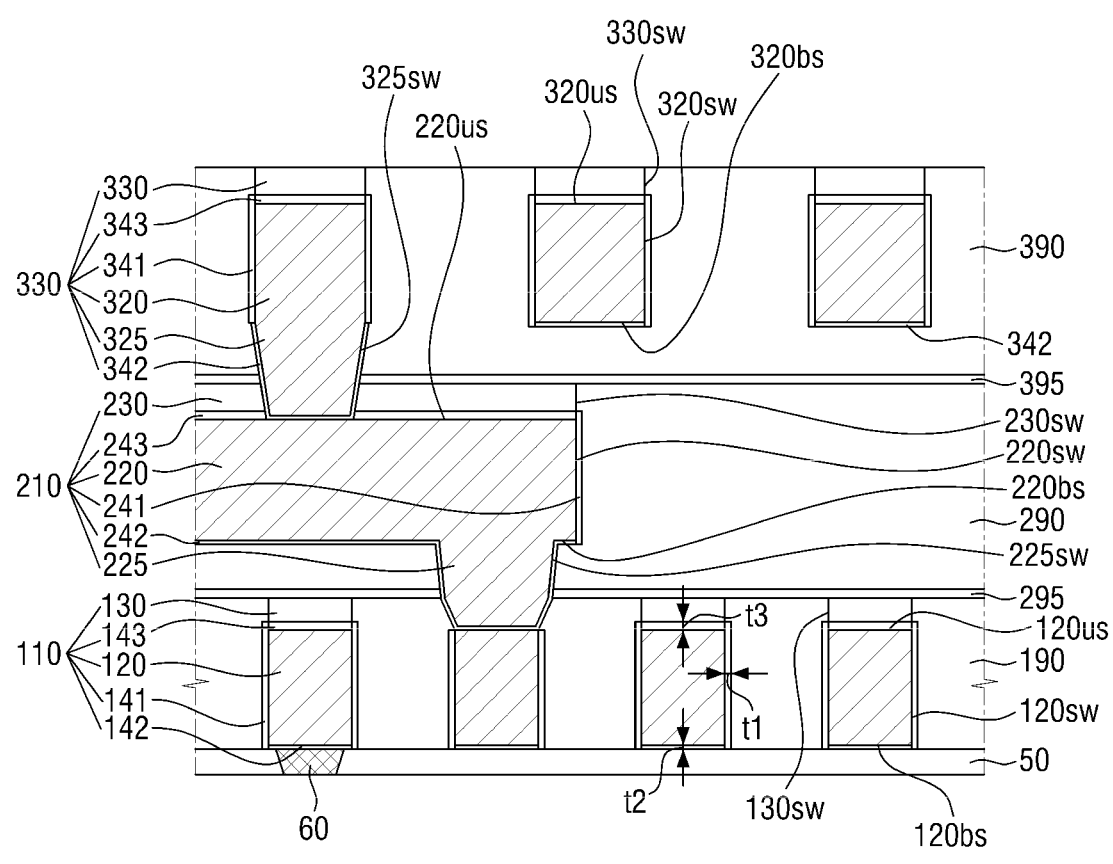

FIGS. 2 to 4 are diagrams for explaining a semiconductor device according to example embodiments, respectively. For convenience of explanation, points different from those explained using FIG. 1 will be mainly explained.

Referring to FIG. 2, in the semiconductor device according to example embodiments, the first level wiring 110 may further include a first bottom graphene film 142. The second level wiring 210 may further include a second bottom graphene film 242. The third level wiring 310 may further include a third bottom graphene film 342.

Each of the first to third bottom graphene films 142, 242, and 342 may include graphene.

The first bottom graphene film 142 may extend along a bottom surface 120*bs* of the first line wiring. The first bottom graphene film 142 may be disposed between the first line wiring 120 and the lower conductive pattern 60, and between the first line wiring 120 and the lower interlayer insulating film 50. The first bottom graphene film 142 may be in contact with the first line wiring 120.

For example, a thickness t2 of the first bottom graphene film 142 is smaller than a thickness t1 of the first side wall graphene film 141.

The first bottom graphene film 142 may improve the adhesive force between the first line wiring 120 and the lower interlayer insulating film 50.

Further, the first bottom graphene film 142 may increase the size of the crystal grains of the metal material included in the first line wiring 120. For example, an example in which the first line wiring 120 is a ruthenium line wiring will be explained. The size of the crystal grains of the ruthenium film formed on the graphene film is larger than the size of the crystal grains of the ruthenium film formed without the graphene film. As the size of the crystal grains increases, a grain boundary between the crystal grains may decrease. Since the grain boundary may act as a resistance to an electron transfer, the resistance of the ruthenium film may decrease as the size of the crystal grains of the ruthenium film increases. That is, the first bottom graphene film 142 may reduce the resistance of the first line wiring 120.

The second bottom graphene film 242 may extend along a bottom surface 220*bs* of the second line wiring 220. The second bottom graphene film 242 may extend along the side wall 225*sw* of the second via 225.

The second bottom graphene film 242 may be disposed between the second via 225 and the first line wiring 120. A part of the second bottom graphene film 242 may extend along the upper surface 120*us* of the first line wiring 120. For example, a part of the second bottom graphene film 242 may contact the upper surface 120*us* of the first line wiring 120. The second bottom graphene film 242 may be in contact with the second line wiring 220 and the second via 225. For example, the second bottom graphene film 242 may contact the bottom surface 220*bs* of the second line wiring 220 and the side wall 225*sw* of the second via 225.

The third bottom graphene film 342 may extend along a bottom surface 320*bs* of the third line wiring 320. The third bottom graphene film 342 may extend along side walls 325*sw* of the third via 325.

The third bottom graphene film 342 may be disposed between the third via 325 and the second line wiring 220. A part of the third bottom graphene film 342 may extend along the upper surface 220*us* of the second line wiring. For example, a part of the third bottom graphene film 342 may contact the upper surface 220*us* of the second line wiring 220. The third bottom graphene film 342 may be in contact with the third line wiring 320 and the third via 325. For example, the third graphene film 342 may contact the bottom surface 320*bs* of the third wiring line 320 and the side surface 325*sw* of the third via 325.

A thickness relationship between the second bottom graphene film 242 and the second side wall graphene film 241, and a thickness relationship between the third bottom graphene film 342 and the third side wall graphene film 341 may be the same as a thickness relationship between the first bottom graphene film 142 and the first side wall graphene film 141.

Unlike the illustrated example, some of the first to third level wiring 110, 210, and 310 may not include the bottom graphene film.

Referring to FIG. 3, in the semiconductor device according to example embodiments, the first level wiring 110 may further include a first upper surface graphene film 143. The second level wiring 210 may further include a second upper surface graphene film 243. The third level wiring 310 may further include a third upper surface graphene film 343.

The first to third upper surface graphene films 143, 243, and 343 may each include graphene.

The first upper surface graphene film 143 may be disposed between the first line wiring 120 and the first insulating capping film 130. The first upper surface graphene film 143 may extend along the upper surface 120us of the first line wiring 120. The first upper surface graphene film 143 may be in contact with the first line wiring 120 and the first insulating capping film 130.

For example, a thickness t3 of the first upper surface graphene film 143 may be greater than or equal to the thickness t1 of the first side wall graphene film 141.

The first upper surface graphene film 143 may protect the first line wiring 120 at the time of the deposition process during the fabricating process. Also, when the electrons moving inside the first line wiring 120 collide with the upper surface 120us of the first line wiring, the first upper surface graphene film 143 may provide a specular reflection of electrons from the upper surface 120us of the first line wiring.

The second upper surface graphene film 243 may be disposed between the second line wiring 220 and the second insulating capping film 230. The second upper surface graphene film 243 may extend along the upper surface 220us of the second line wiring 220. The second upper surface graphene film 243 may be in contact with the second line wiring 220 and the second insulating capping film 230.

A third upper surface graphene film 343 may be disposed between the third line wiring 320 and the third insulating capping film 330. The third upper surface graphene film 343 may extend along the upper surface 320us of the third line wiring 320. The third upper surface graphene film 343 may be in contact with the third line wiring 320 and the third insulating capping film 330.

A thickness relationship between the second upper surface graphene film 243 and the second side wall graphene film 241, and a thickness relationship between the third upper surface graphene film 343 and the third side wall graphene film 341 may be the same as a thickness relationship between the first upper surface graphene film 143 and the first side wall graphene film 141. For example, a thickness of the second upper surface graphene film 243 may be greater than or equal to a thickness of the second side wall graphene film 241, and a thickness of the third upper surface graphene film 343 may be greater than or equal to a thickness of the third side wall graphene film 341.

Unlike the illustrated example, some of the first to third level wiring 110, 210, and 310 may not include the upper surface graphene film.

Referring to FIG. 4, in the semiconductor device according to example embodiments, the first level wiring 110 may further include a first bottom graphene film 142 and a first upper surface graphene film 143. The second level wiring 210 may further include a second bottom graphene film 242 and a second upper surface graphene film 243. The third level wiring 310 may further include a third bottom graphene film 342 and a third upper surface graphene film 343.

Explanations of the first to third bottom graphene films 142, 242, and 342 may be substantially the same as that explained using FIG. 2.

Explanations of the first to third upper surface graphene films 143, 243, and 343 may be substantially the same as that explained using FIG. 3.

For example, the thickness t1 of the first side wall graphene film 141 is greater than the thickness t2 of the first bottom graphene film 142. The thickness t1 of the first side wall graphene film 141 is smaller than or equal to the thickness t3 of the first upper surface graphene film 143.

Unlike the illustrated example, some of the first to third level wirings 110, 210, and 310 may not include at least one of the bottom graphene film and the upper surface graphene film.

Figure 5:
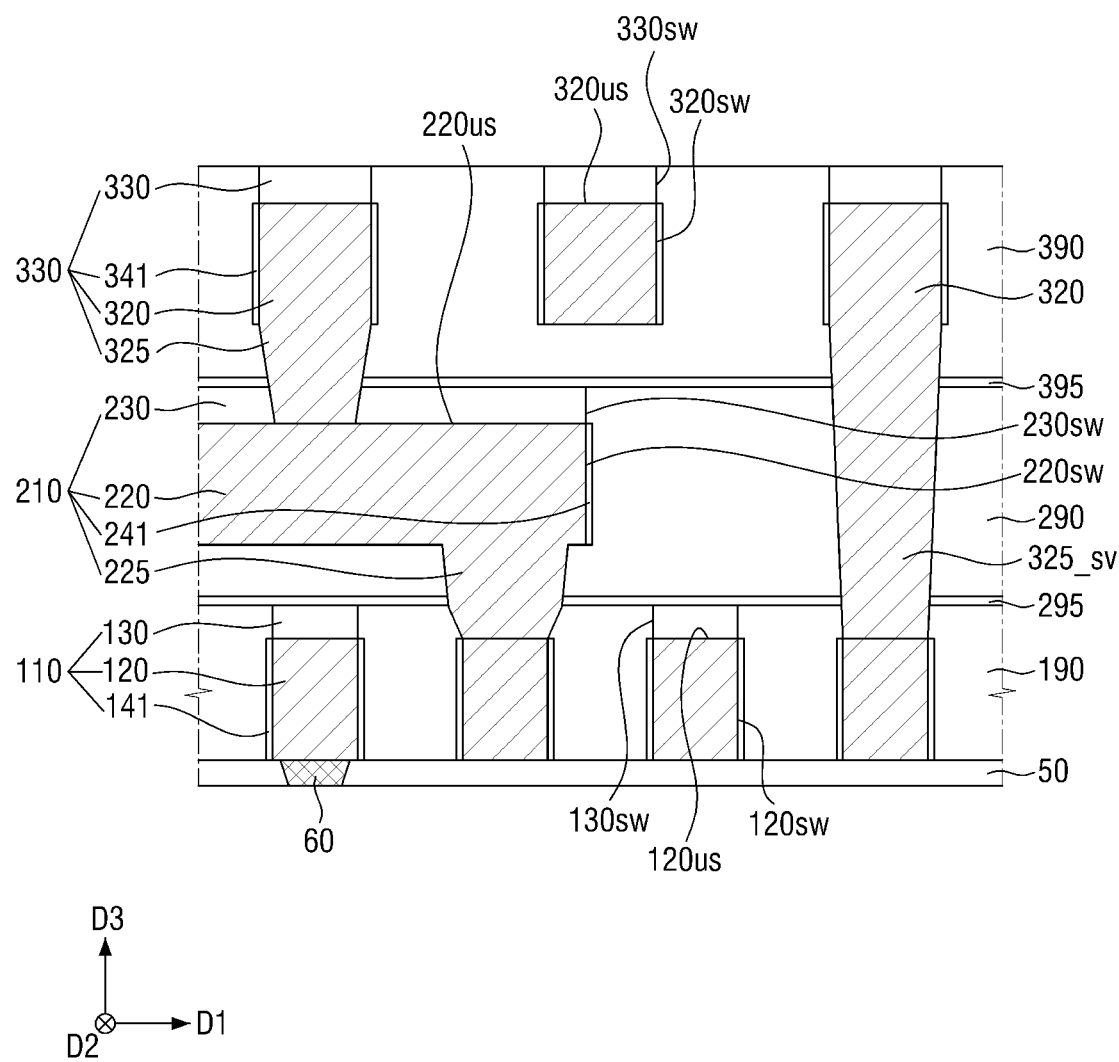
FIGS. 5 to 7 are diagrams for explaining a semiconductor device, according to example embodiments, respectively.
Figure 6:
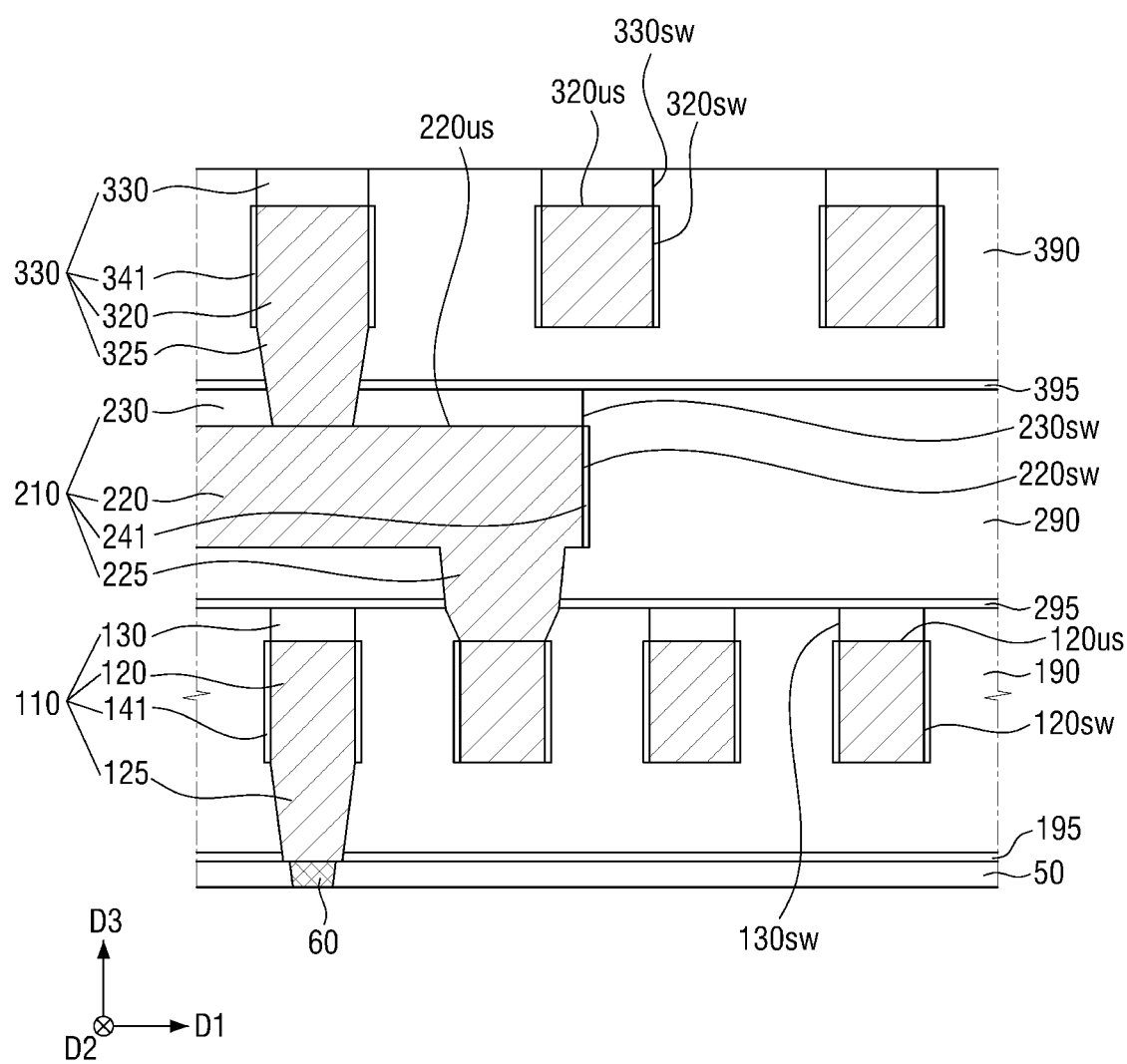
Figure 7:
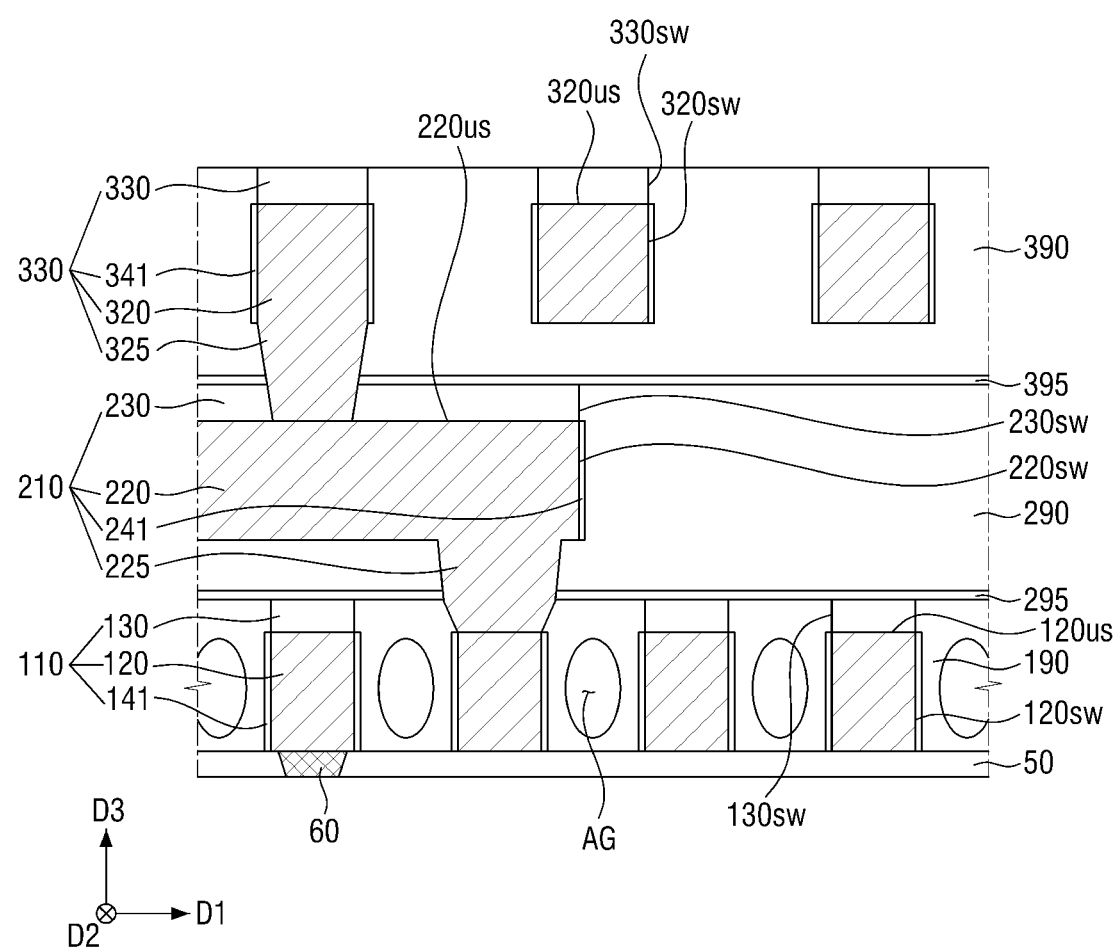

FIGS. 5 to 7 are diagrams for explaining a semiconductor device according to example embodiments. For convenience of explanation, points different from those explained using FIG. 1 will be mainly explained.

Referring to FIG. 5, in the semiconductor device according to example embodiments, at least one of the third level wirings 310 may include a third long via 325_sv.

The third long via 325_sv may be directly connected to the first level wiring 110, contacting an upper surface 120us of the first level wiring 110. The third long via 325_sv may connect the third line wiring 320 and the first line wiring 120 without passing through the second level wiring 210.

The third long via 325_sv may penetrate a third etching stop film 395, a second interlayer insulating film 290, a second etching stop film 295, and a first insulating capping film 130. The length of the third long via 325_sv is longer than the length of the third via 325.

When the third level wiring 310 includes a third bottom graphene film (342 of FIG. 2), the third bottom graphene film 342 that extends along the side wall of the third long via 325_sv may extend from the third line wiring 320 to the first line wiring 120. For example, a portion of the third bottom graphene film 342 may contact the upper surface 120us of the first level wiring 120.

Although the third long via 325_sv is shown as being in contact with the third etching stop film 395, the embodiment is not limited thereto. Unlike the illustrated example, the third etching stop film 395 may include an opening through which the third long via 325_sv may pass. Since the third long via 325_sv passes through the opening included in the third etching stop film 395, the third etching stop film 395 may not be in contact with the third etching stop film 395.

Referring to FIG. 6, in the semiconductor device according to example embodiments, the first level wiring 110 may further include a first via 125.

The first etching stop film 195 may be disposed on the lower interlayer insulating film 50. The first etching stop film 195 may extend along the upper surface of the lower interlayer insulating film 50.

The first etching stop film 195 may include at least one of silicon nitride, silicon carbonitride, silicon oxycarbide, silicon oxynitride, silicon oxide, and silicon oxycarbonitride.

The first via 125 may be disposed between the first line wiring 120 and the lower conductive pattern 60. The first via 125 may be connected to the first line wiring 120 and the lower conductive pattern 60. The first via 125 may have a contact shape. The first via 125 may penetrate the first etching stop film 195 and be connected to the lower conductive pattern 60.

The first via 125 may be directly connected to the first line wiring 120. For example, the first via 125 and the first line wiring 120 may have an integral structure. For example, the first via 125 and the first line wiring 120 may be formed at the same time and of the same material, without a break in the continuity of the material of which they are formed.

The first line wiring 120 may not be in contact with the first etching stop film 195.

Referring to FIG. 7, in the semiconductor device according to some embodiments, the first interlayer insulating film 190 may include an air gap AG disposed on at least one side of the first level wiring 110.

It is possible to reduce a coupling phenomenon between the first line wirings 120 adjacent to each other in the first direction D1 through the air gap AG.

Unlike the illustrated example, the second interlayer insulating film 290 may include an air gap between the second line wirings 220 adjacent to each other in the second direction D2. Also, the third interlayer insulating film 390 may include an air gap between the third line wirings 320 adjacent to each other in the first direction D1.

Figure 8:
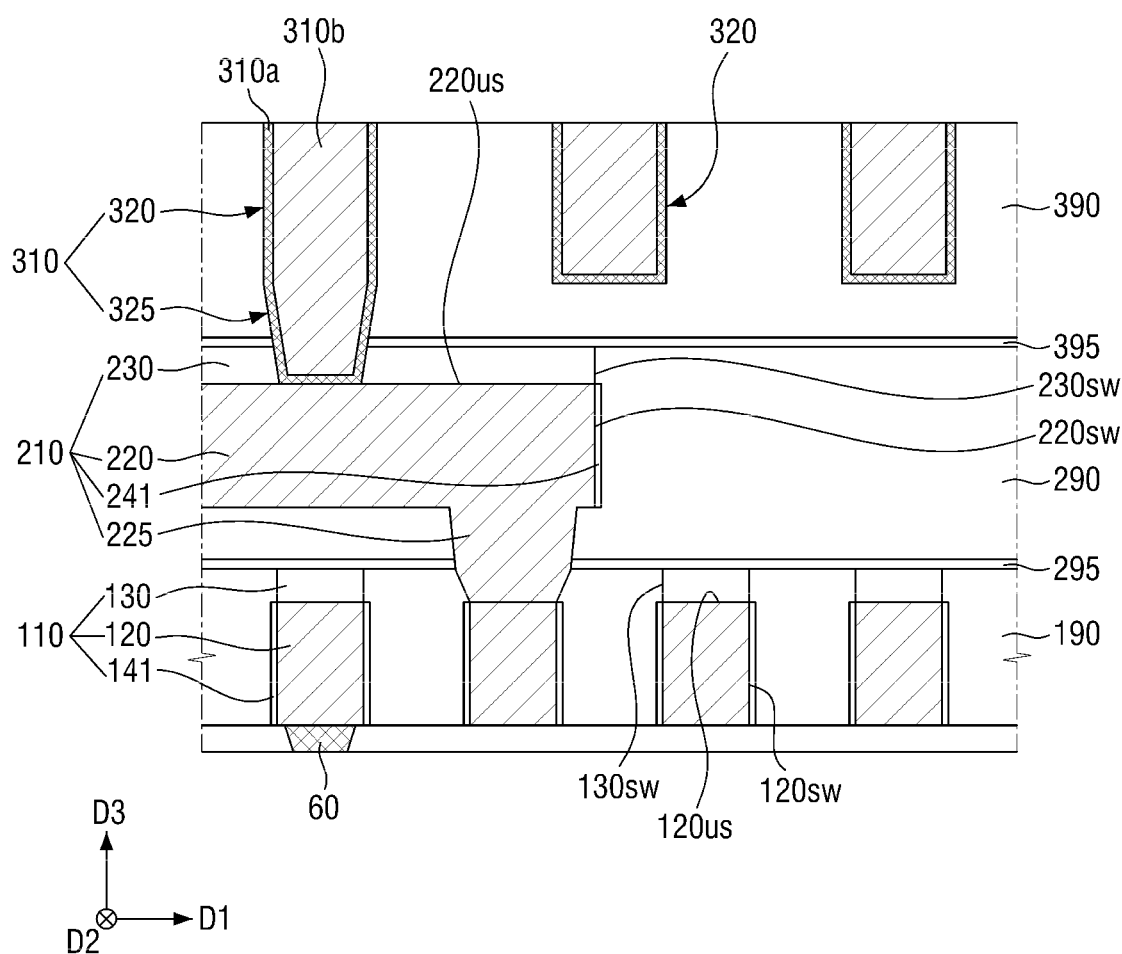
FIG. 8 is a diagram for explaining a semiconductor device, according to example embodiments.

FIG. 8 is a diagram for explaining a semiconductor device according to example embodiments. For convenience of explanation, points different from those explained using FIG. 1 will be mainly explained.

Referring to FIG. 8, in the semiconductor device according to example embodiments, the third level wiring 310 may include a first wiring filling film 310b and a first wiring barrier film 310a.

The third level wiring 310 does not include a third insulating capping film (e.g., third insulating capping film 330 of FIG. 1). Also, the third level wiring 310 may not include the third side wall graphene film (e.g., third side wall graphene film 341 of FIG. 1).

The first wiring barrier film 310a may extend along the side wall and bottom surface of the first wiring filling film 310b.

The third line wiring 320 and the third via 325 each include a first wiring filling film 310b and a first wiring barrier film 310a. The first wiring filling film 310b of the third line wiring 320 is directly connected to the first wiring filling film 310b of the third via 325. For example, the first wiring filling film 310b of the third line wiring 320 and the first wiring filling film 310b of the third via 325 may have an integral structure.

The first wiring barrier film 310a includes a conductive material including metal, and may include, for example, but is not limited to, at least one of tantalum (Ta), tantalum nitride (TaN), titanium (Ti), titanium nitride (TiN), tungsten (W), tungsten nitride (WN), and tungsten carbonitride (WCN).

The first wiring filling film 310b may include, for example, at least one of aluminum (Al), copper (Cu), tungsten (W), and cobalt (Co). In the semiconductor device according to some embodiments, the first wiring filling film 310b may include copper.

When the first wiring filling film 310b includes copper, the copper included in each first wiring filling film 310b may include, for example, at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr).

The width of the third line wiring 320 in the first direction D1 is greater than the width of the first line wiring 120 in the first direction D1 and the width of the second line wiring 220 in the second direction D2. In the layout of the semiconductor device, if the width of the first wiring filling film 310b of the third line wiring 320 may be sufficiently large, the use of a material having a small bulk specific resistance while having the large eMFP can improve the performance of the semiconductor device.

As a result, the materials included in the first line wiring 120 and the second line wiring 220 may be different from the materials included in the first wiring filling film 310b of the third line wiring 320.

Although the width of the third line wiring 320 in the first direction D1 is shown to be constant as it moves along the third direction D3, the present disclosure is not limited thereto. Unlike the illustrated example, the width of the third line wiring 320 in the first direction D1 may increase as the third line wiring 320 goes away from the third etching stop film 395 in the third direction D3. At this time, the width of the third line wiring 320 in the second direction D2 may also increase as the third line wiring 320 goes away from the third etching stop film 395 in the third direction D3.

The third level wiring 310 may be formed through, for example, a damascene process.

Figure 9:
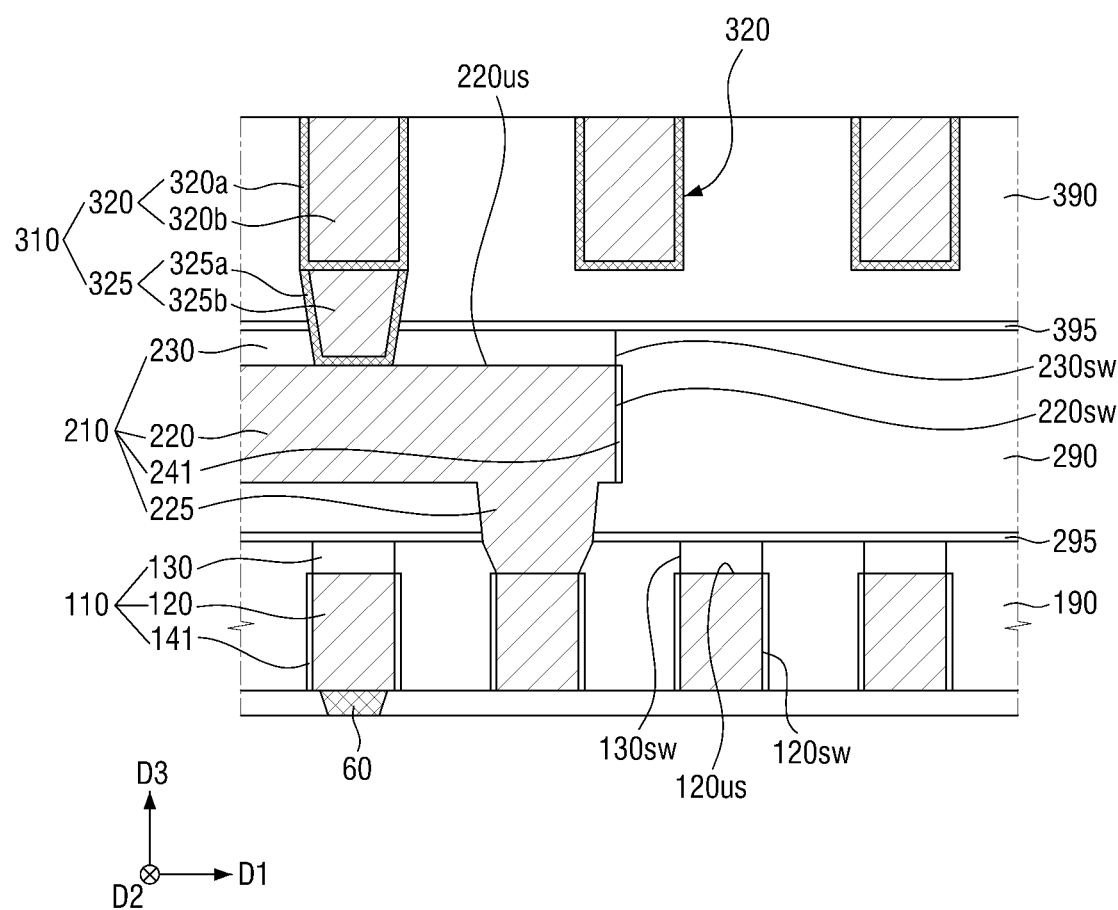
FIG. 9 is a diagram for explaining a semiconductor device, according to example embodiments.

FIG. 9 is a diagram for explaining a semiconductor device according to example embodiments. For convenience of explanation, points different from those explained using FIG. 8 will be mainly explained.

Referring to FIG. 9, in a semiconductor device according to example embodiments, the third line wiring 320 may include an upper wiring filling film 320b and an upper wiring barrier film 320a. The third via 325 may include a lower wiring filling film 325b and a lower wiring barrier film 325a.

The upper wiring filling film 320b may be spaced apart from the lower wiring filling film 325b. The upper wiring barrier film 320a may be disposed between the upper wiring filling film 320b and the lower wiring filling film 325b.

The upper wiring barrier film 320a and the lower wiring barrier film 325a each include conductive materials including metal, and may include, for example, but is not limited to, at least one of tantalum (Ta), tantalum nitride (TaN), titanium (Ti), titanium nitride (TiN), tungsten (W), tungsten nitride (WN), and tungsten carbonitride (WCN).

The upper wiring filling film 320b and the lower wiring filling film 325b may each include at least one of aluminum (Al), copper (Cu), tungsten (W), and cobalt (Co).

Figure 10:
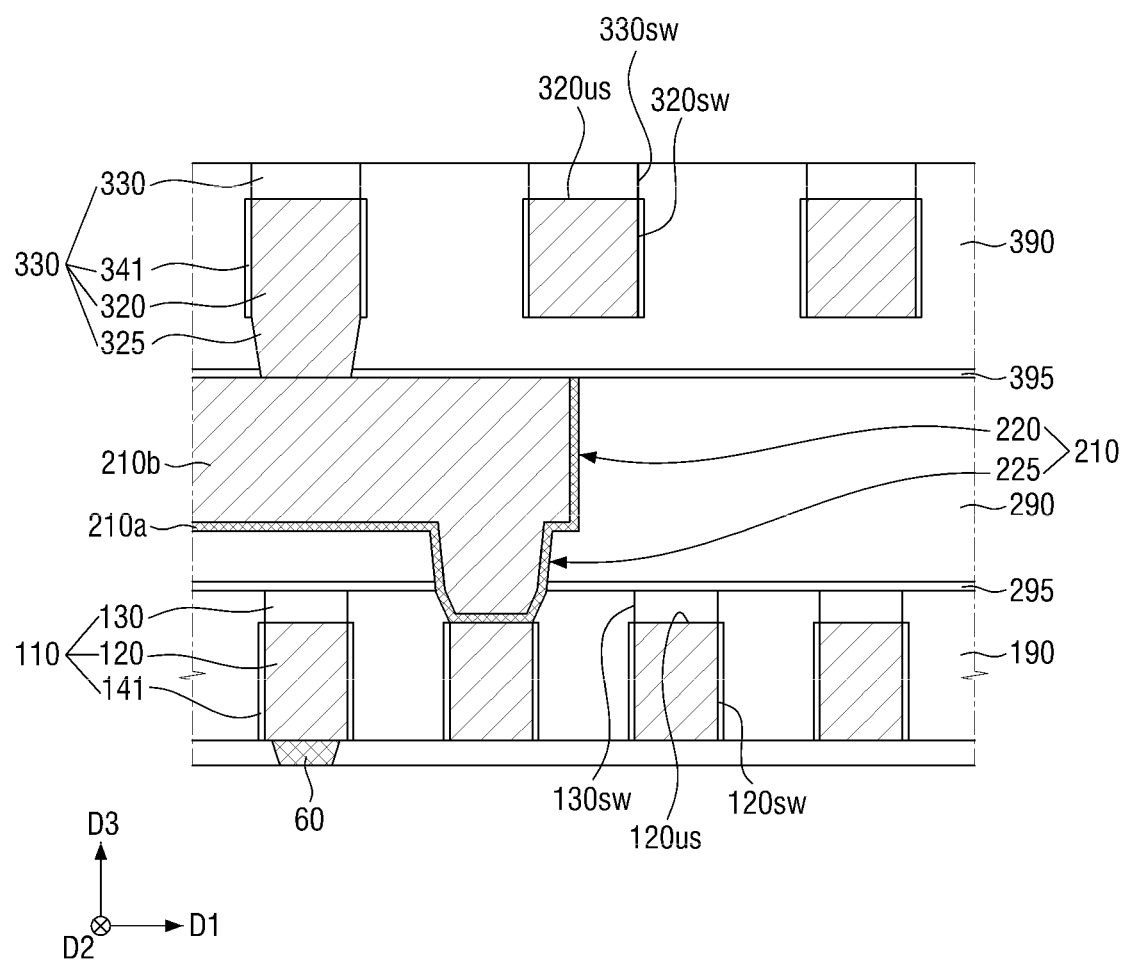
FIG. 10 is a diagram for explaining a semiconductor device, according to example embodiments.

FIG. 10 is a diagram for explaining a semiconductor device according to example embodiments. For convenience of explanation, points different from those explained using FIG. 1 will be mainly explained.

Referring to FIG. 10, in the semiconductor device according to example embodiments, the second level wiring 210 may include a second wiring filling film 210b and a second wiring barrier film 210a.

The second level wiring 210 does not include a second insulating capping film (e.g., second insulating capping film 230 of FIG. 1). Also, the second level wiring 210 may not include the second side wall graphene film (e.g., second side wall graphene film 241 in FIG. 1).

The second wiring barrier film 210a may extend along a side wall and a bottom surface of the second wiring filling film 210b.

The second line wiring 220 and the second via 225 each include a second wiring filling film 210b and a second wiring barrier film 210a. The second wiring filling film 210b of the second line wiring 220 is directly connected to the second wiring filling film 210b of the second via 225. The second wiring barrier film 210a may contact the upper surface 120us of the first line wiring 120.

The second wiring barrier film 210a includes a conductive material including metal, and may include, for example, but is not limited to, at least one of tantalum (Ta), tantalum nitride (TaN), titanium (Ti), titanium nitride (TiN), tungsten (W), tungsten nitride (WN), and tungsten carbonitride (WCN).

The second wiring filling film 210b may include, for example, at least one of aluminum (Al), copper (Cu), tungsten (W), and cobalt (Co). In the semiconductor device according to some embodiments, the second wiring filling film 210b may include copper.

The material included in the first line wiring 120 and the third line wiring 320 may be different from the material included in the second wiring filling film 210b of the second line wiring 220.

In FIGS. 8 to 10, the width of the first line wiring 120 in the first direction, the width of the second line wiring 220 in the second direction D2, and the width of the third line wiring 320 in the first direction D1 may be different from each other.

In such a case, the materials used for the line wiring may be changed depending on the width of the wiring. For example, when the same wiring as the first level wiring 110 is used for a metal level having a small wiring width, it is possible to reduce the resistance of the wiring. However, when the third level wiring 310 of FIGS. 8 and 9 or the second level wiring 210 of FIG. 10 is used for a metal level having a large wiring width, it is possible to reduce the resistance of the wiring.

Therefore, in the layout of each metal level of BEOL (Back-end-of-line), as the wiring width changes, the material of the line wiring used for each metal level may be changed.

Figure 11:
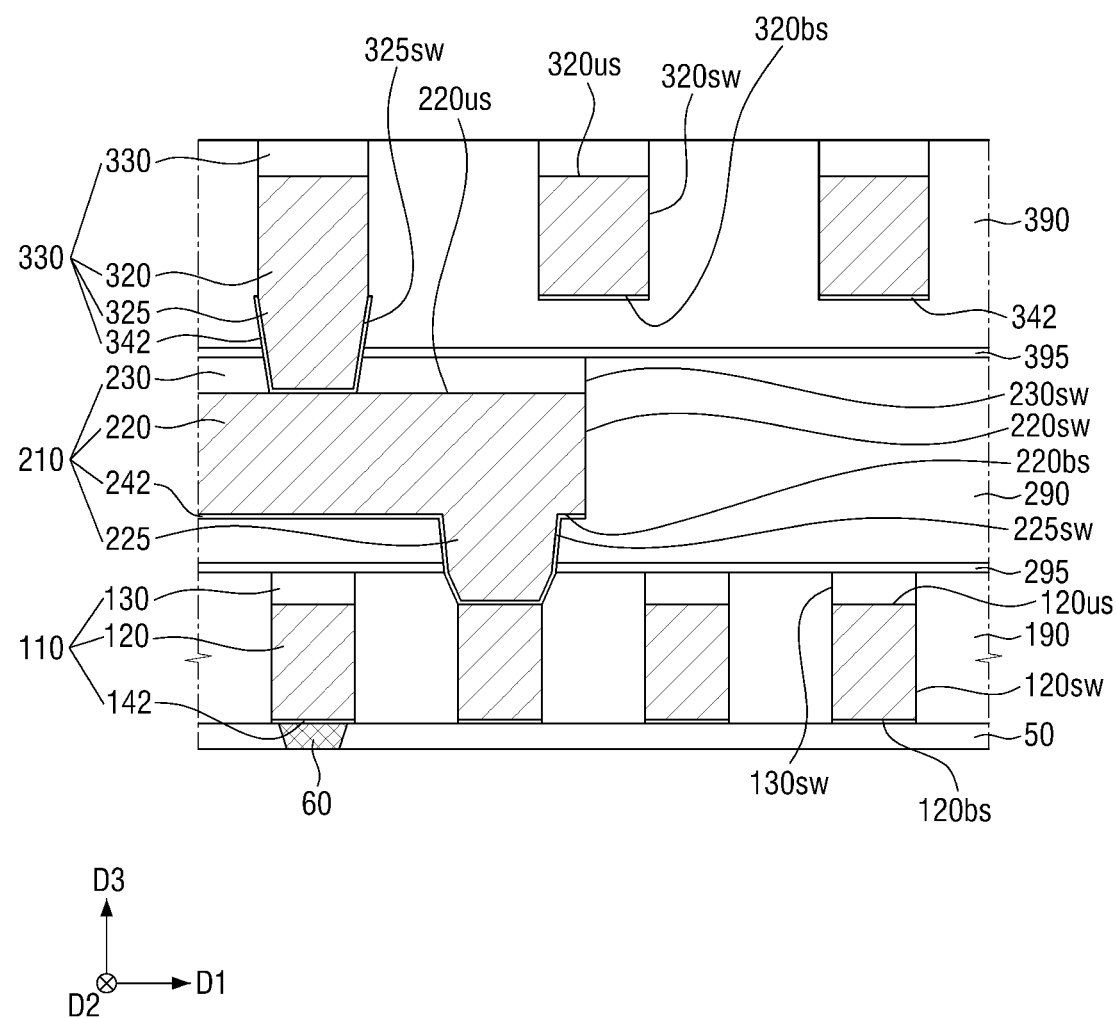
FIGS. 11 to 13 are diagrams for explaining a semiconductor device, according to example embodiments, respectively.
Figure 12:
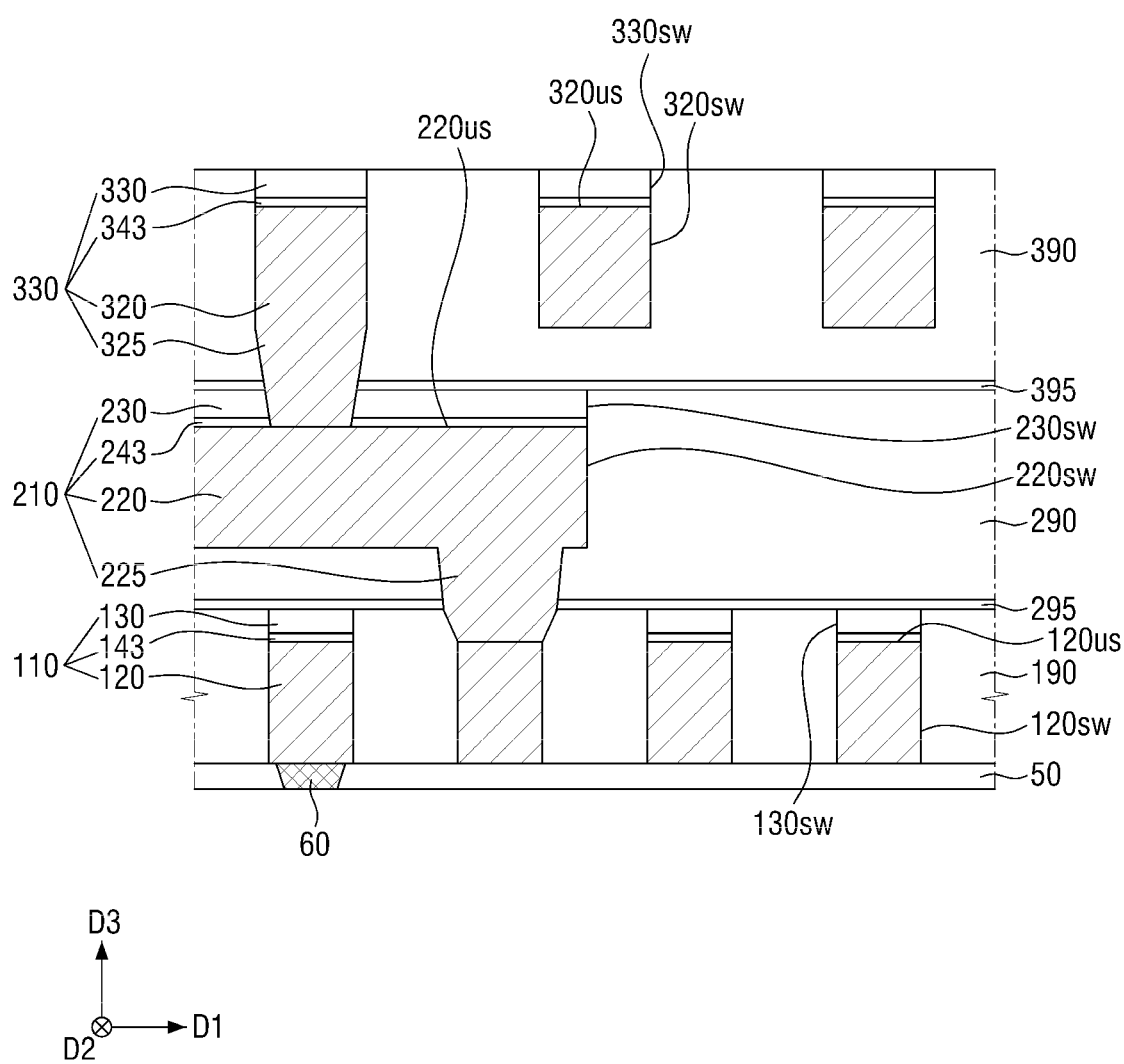
Figure 13:
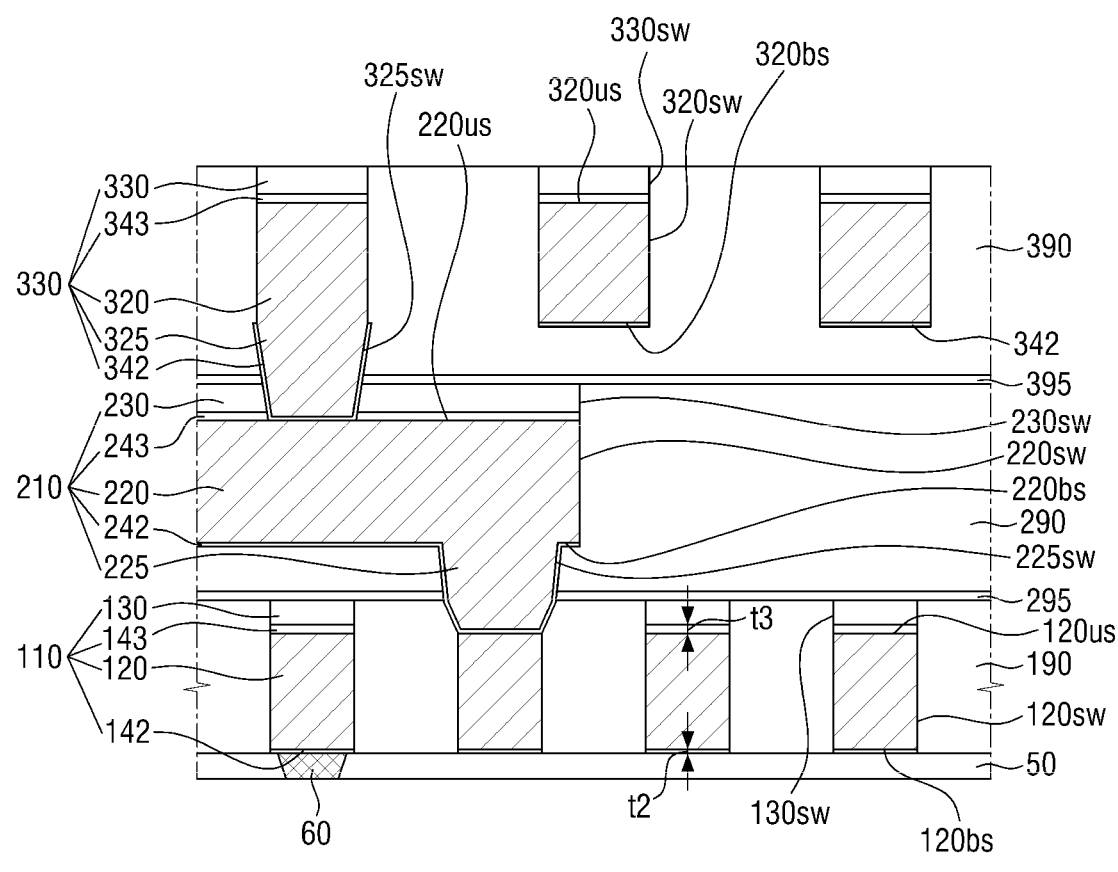

FIGS. 11 to 13 are diagrams for explaining a semiconductor device according to example embodiments, respectively. For convenience of explanation, points different from those explained using FIG. 1 will be mainly explained.

Referring to FIG. 11, in the semiconductor devices according to example
embodiments, the first to third level wirings 110, 210, and 310 do not include the side wall graphene films (e.g., side wall graphene films 141, 241, and 341 of FIG. 1), but may include bottom graphene films 142, 242, and 342.

Explanation of the first to third bottom graphene films 142, 242, and 342 may be substantially the same as that explained using FIG. 2.

Referring to FIG. 12, in the semiconductor devices according to example embodiments, the first to third level wirings 110, 210, and 310 do not include the side wall graphene films (141, 241, and 341 of FIG. 1), but may include the upper surface graphene films 143, 243, and 343.

Explanation of the first to third upper surface graphene films 143, 243, and 343 may be substantially the same as that explained using FIG. 3.

Referring to FIG. 13, in the semiconductor device according to example embodiments, the first to third level wirings 110, 210, and 310 do not include side wall graphene films (e.g., side wall graphene films 141, 241, and 341 of FIG. 1), but may include bottom graphene films 142, 242, and 342 and upper surface graphene films 143, 243, and 343.

A thickness t3 of the first upper surface graphene film 143 is greater than a thickness t2 of the first bottom graphene film 142. A thickness relationship between the second upper surface graphene film 243 and the second bottom graphene film 242, and a thickness relationship between the third upper surface graphene film 343 and the third bottom graphene film 342 may be the same as a thickness relationship between the first upper surface graphene film 143 and the first bottom graphene film 142.

Figure 14:
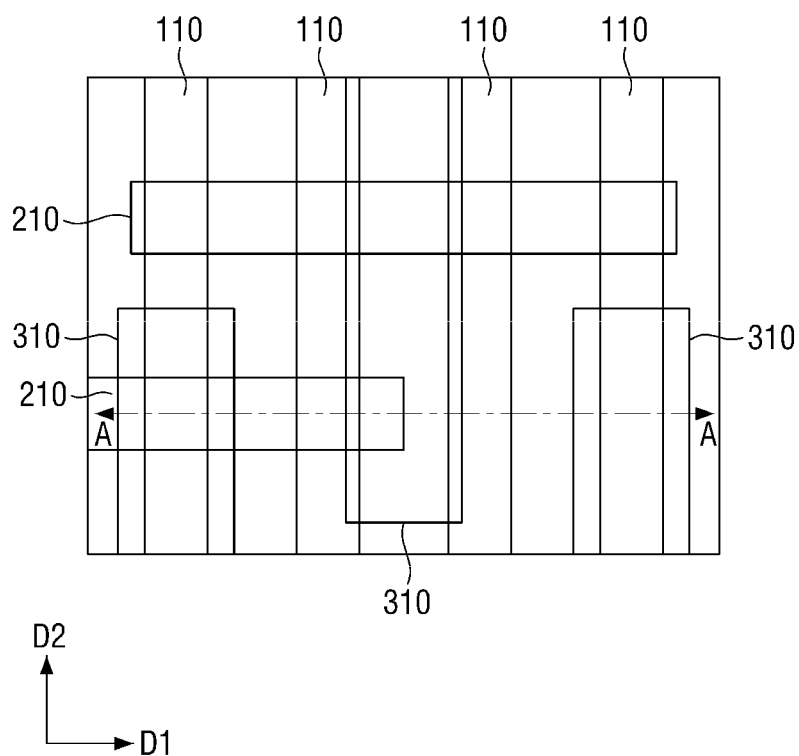
FIG. 14 is a layout view for explaining a semiconductor device, according to example embodiments.
Figure 15:
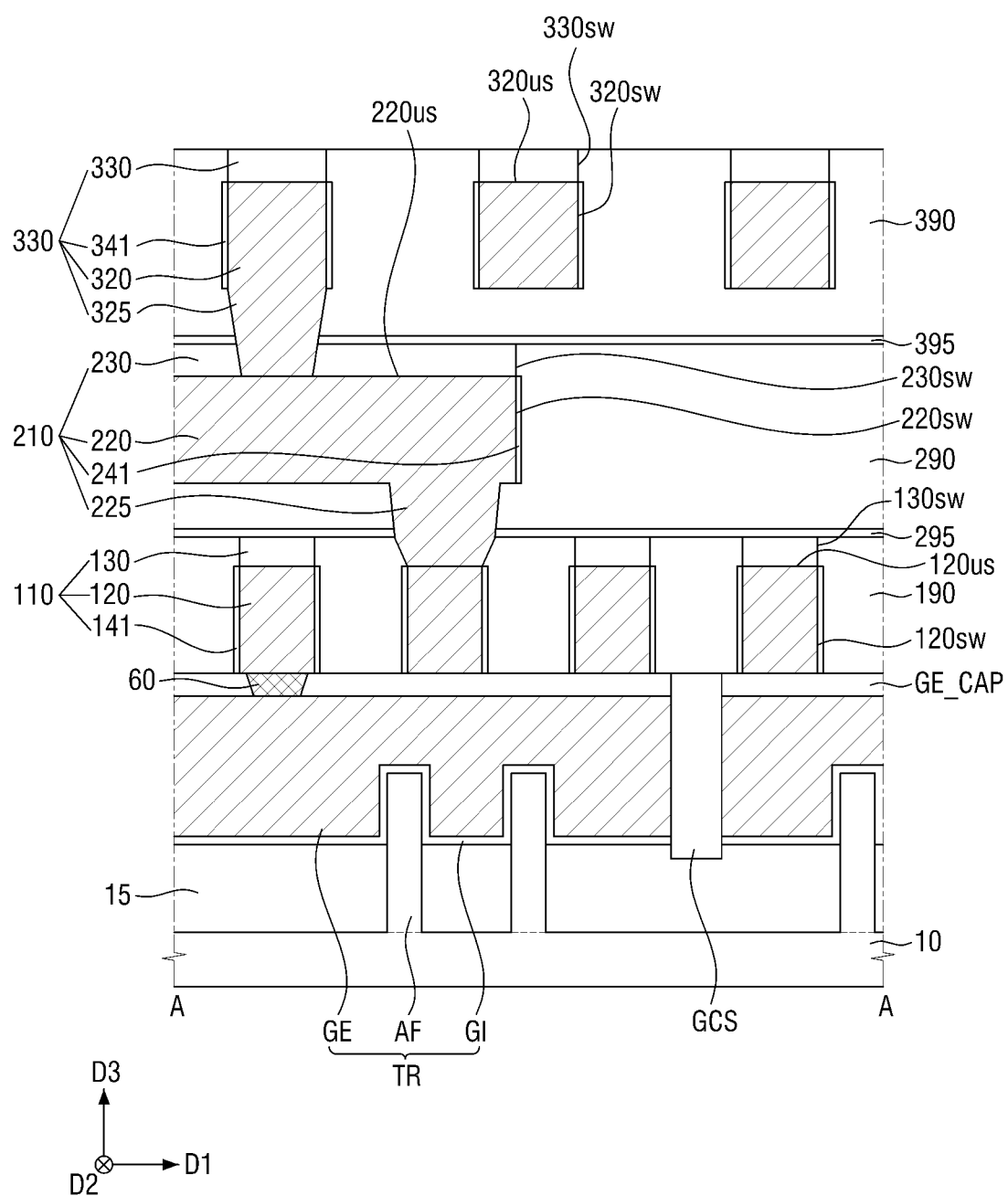
FIG. 15 is an exemplary cross-sectional view taken along a line A-A of FIG. 14.

FIG. 14 is a layout view for explaining a semiconductor device according to example embodiments. FIG. 15 is an exemplary cross-sectional view taken along a line A-A of FIG. 14.

For reference, the explanation of the first level wiring 110, the second level wiring 210, and the third level wiring 310 of FIG. 15 may be substantially the same as that explained using FIG. 1. The following explanation will be focused on the points different from FIG. 1.

Although FIG. 15 shows that a fin type pattern AF extends in the second direction D2 and a gate electrode GE extends in the first direction D1, the present disclosure is not limited thereto.

Referring to FIGS. 14 and 15, the semiconductor device according to example embodiments may include a transistor TR disposed between the substrate 10 and the first level wiring 110.

The substrate 10 may be a silicon substrate or SOI (silicon-on-insulator). Alternatively, the substrate 10 may include, but is not limited to, silicon germanium, SGOI (silicon germanium on insulator), indium antimonide, lead tellurium compounds, indium arsenide, indium phosphide, gallium arsenide or gallium antimonide.

The transistor TR may include a fin type pattern AF, a gate electrode GE on the fin type pattern AF, and a gate insulating film GI between the fin type pattern AF and the gate electrode GE.

Although not shown, the transistor TR may further include a source/drain pattern (e.g., source/drain pattern SDE of FIG. 17) disposed on both sides of the gate electrode GE.

The fin type pattern AF may protrude from the substrate 10 in the third direction D3. The fin type pattern AF may extend lengthwise in the second direction D2. The fin type pattern AF may also be a part of the substrate 10 and may include an epitaxial layer that is grown from the substrate 10. The fin type pattern AF may include, for example, silicon or germanium which is an elemental semiconductor material. Also, the fin type pattern AF may include a compound semiconductor, and may include, for example, a group IV-IV compound semiconductor or a group III-V compound semiconductor.

The group IV-IV compound semiconductor may be, for example, a binary compound or a ternary compound including at least two of carbon (C), silicon (Si), germanium (Ge), and tin (Sn) or a compound obtained by doping these elements with a group IV element. The group III-V compound semiconductor may be, for example, one of a binary compound, a ternary compound or a quaternary compound obtained by combining at least one of aluminum (Al), gallium (Ga) and indium (In) as a group III element with one of phosphorus (P), arsenic (As) and antimony (Sb) as a group V element.

The field insulating film 15 may be formed on the substrate 10. The field insulating film 15 may be formed on a part of the side walls of the fin type pattern AF. The fin type pattern AF may protrude upward from the upper surface of the field insulating film 15. The field insulating film 15 may include, for example, an oxide film, a nitride film, an oxynitride film or a combination thereof.

The gate electrode GE may be disposed on the fin type pattern AF. The gate electrode GE may extend lengthwise in the first direction D1. The gate electrode GE may intersect the fin type pattern AF.

The gate electrode GE may include, for example, at least one of metal, conductive metal nitride, conductive metal carbonitride, conductive metal carbide, metal silicide, doped semiconductor material, conductive metal oxynitride and conductive metal oxide.

The gate insulating film GI may be disposed between the gate electrode GE and the fin type pattern AF, and between the gate electrode GE and the field insulating film 15. The gate insulating film GI may include, for example, silicon oxide, silicon oxynitride, silicon nitride, or a high dielectric constant material having a higher dielectric constant than silicon oxide. The high dielectric constant material may include, for example, at least one of boron nitride, metal oxide, and metal silicon oxide.

A gate separation structure GCS may be disposed on the field insulating film 15. The gate separation structure GCS may separate the gate electrodes GE adjacent to each other in the first direction D1. The gate separation structure GCS may include, for example, an insulating material.

Although the gate insulating film GI does not extend on the side walls of the gate separation structure GCS in the third direction D3, the present disclosure is not limited thereto. Unlike the illustrated example, the gate insulating film GI may extend on the side walls of the gate separation structure GCS in the third direction D3.

A gate capping pattern GE_CAP may be disposed on the gate electrode GE. The gate capping pattern GE_CAP may be a part of the lower interlayer insulating film 50 of FIG. 1.

The lower conductive pattern 60 may be disposed on the gate electrode GE. The lower conductive pattern 60 may be connected to the gate electrode GE. For example, the lower conductive pattern 60 may be a gate contact.

Figure 17:
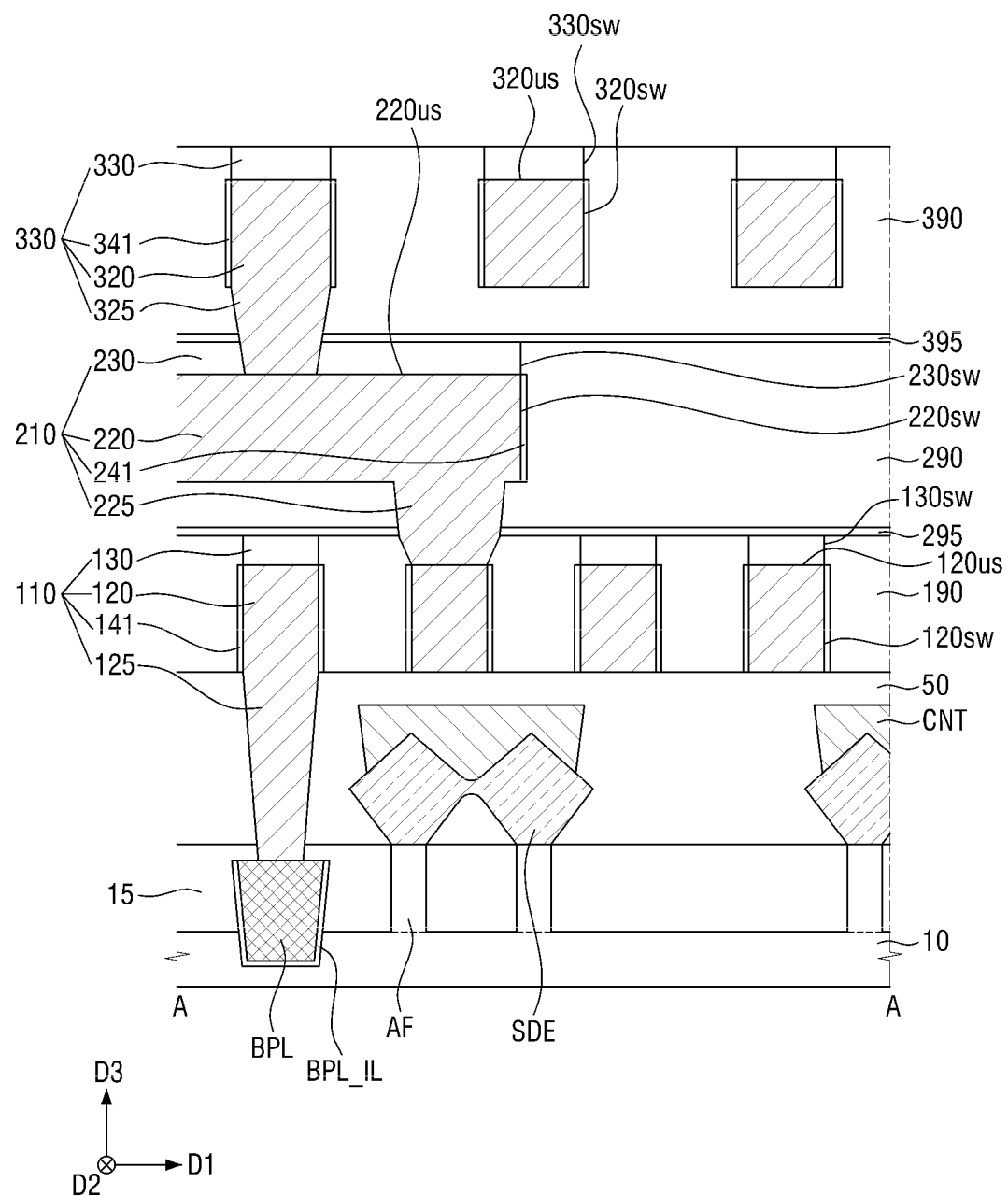
FIG. 17 is a diagram for explaining a semiconductor device, according to example embodiments.

Unlike the illustrated example, the lower conductive pattern 60 may, of course, be a connection contact connected to the source/drain contact CNT of FIG. 17.

Figure 16:
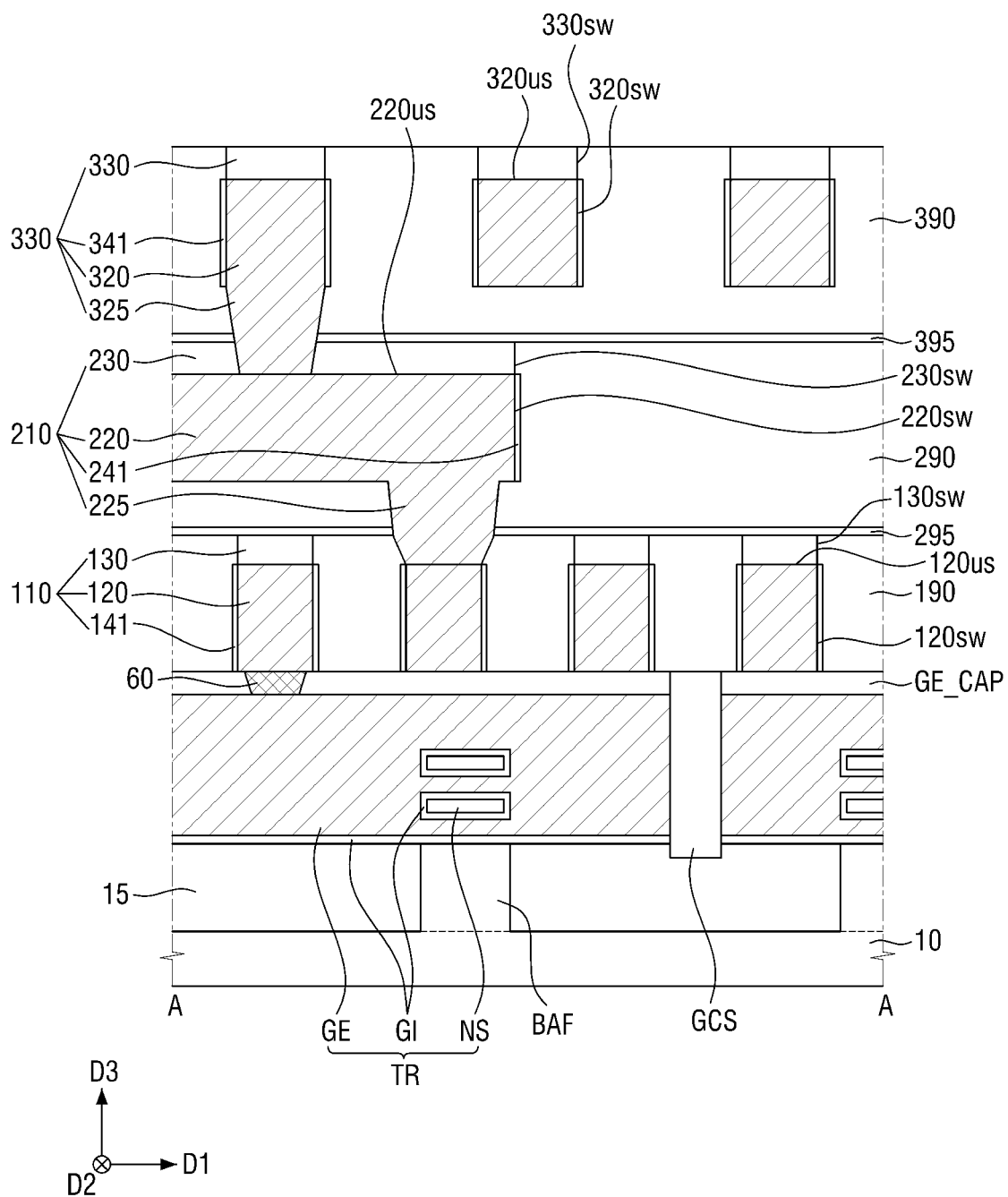
FIG. 16 is a diagram for explaining a semiconductor device, according to example embodiments.

FIG. 16 is a diagram for explaining a semiconductor device according to example embodiments. For convenience of explanation, points different from those explained using FIGS. 14 and 15 will be mainly explained.

Referring to FIG. 16, in the semiconductor device according to some embodiments, a transistor TR may include a nanosheet NS, a gate electrode GE surrounding the nanosheet NS, and a gate insulating film GI between the nanosheet NS and the gate electrode GE.

The nanosheet NS may be disposed on a lower fin type pattern BAF. The nanosheet NS may be spaced apart from the lower fin type pattern BAF in the third direction D3. Although the transistor TR is shown as including two nanosheets NS spaced apart from each other in the third direction D3, the embodiment is not limited thereto. It is a matter of course that the number of nanosheets NS disposed on the lower fin type pattern BAF in the third direction D3 may be more than or smaller than two.

The lower fin type pattern BAF and the nanosheet NS may each include, for example, silicon or germanium as an elemental semiconductor material. Each of the lower fin type pattern BAF and the nanosheet NS may include compound semiconductors, and may include, for example, a group IV-IV compound semiconductor or a group III-V compound semiconductor. The lower fin type pattern BAF and the nanosheet NS may include the same material or different materials from each other.

FIG. 17 is a diagram for explaining a semiconductor device according to example embodiments. For convenience of explanation, points different from those explained using FIGS. 14 and 15 will be mainly explained.

Referring to FIG. 17, the semiconductor device according to example embodiments may further include a buried power rail BPL connected to the first level wiring 110.

The buried power rail BPL may extend in the second direction D2. The buried power rail BPL may be aligned with the fin type pattern AF.

At least a part of the buried power rail BPL may be buried in the substrate 10. For example, the buried power rail BPL may be disposed in the substrate 10 and the field insulating film 15. A part of the buried power rail BPL may be disposed inside the substrate 10. The field insulating film 15 may cover the rest of the buried power rail BPL.

The buried power rail BPL may be a metal wiring that supplies power to the semiconductor device. The buried power rail BPL may include, for example, at least one of metal and metal alloy.

A power rail liner BPL_IL may extend along the side walls and bottom surface of the buried power rail BPL. The buried power rail BPL may be disposed on the power rail liner BPL_IL.

The power rail liner BPL_IL may electrically insulate the buried power rail BPL from the substrate 10. The power rail liner BPL_IL may include an insulating material.

Unlike the illustrated example, when the buried power rail BPL is applied to FIG. 16, the buried power rail BPL may be aligned with the lower fin type pattern BAF.

A source/drain pattern SDE may be disposed on the fin type pattern AF. The source/drain pattern SDE may be included in a source/drain region of the transistor TR of FIG. 15.

Although the source/drain patterns SDE on the adjacent fin type patterns AFs are shown as being connected to each other, this is only for convenience of explanation, and the present disclosure is not limited thereto.

The source/drain contact CNT may be disposed on the source/drain pattern SDE.

The lower interlayer insulating film 50 may be disposed on the field insulating film 15. The lower interlayer insulating film 50 may cover the source/drain pattern SDE and the source/drain contact CNT. The lower conductive pattern (e.g., lower conductive pattern 60 of FIG. 1) disposed in the lower interlayer insulating film 50 of FIG. 1 is not shown in FIG. 17.

The first level wiring 110 may be connected to the buried power rail BPL. The first via 125 passing through the lower interlayer insulating film 50 and the field insulating film 15 may connect the buried power rail BPL and the first line wiring 120. The first line wiring 120 and the first via 125 may have an integral structure.

Unlike the illustrated example, in other embodiments, the buried power rail BPL may be connected to the second level wiring 210. At least one of the second level wirings 210 may include a second long via such as the third long via 325_sv explained in FIG. 5. The second line wiring 220 and the buried power rail BPL may be connected to each other through the second long via.

Figure 18:
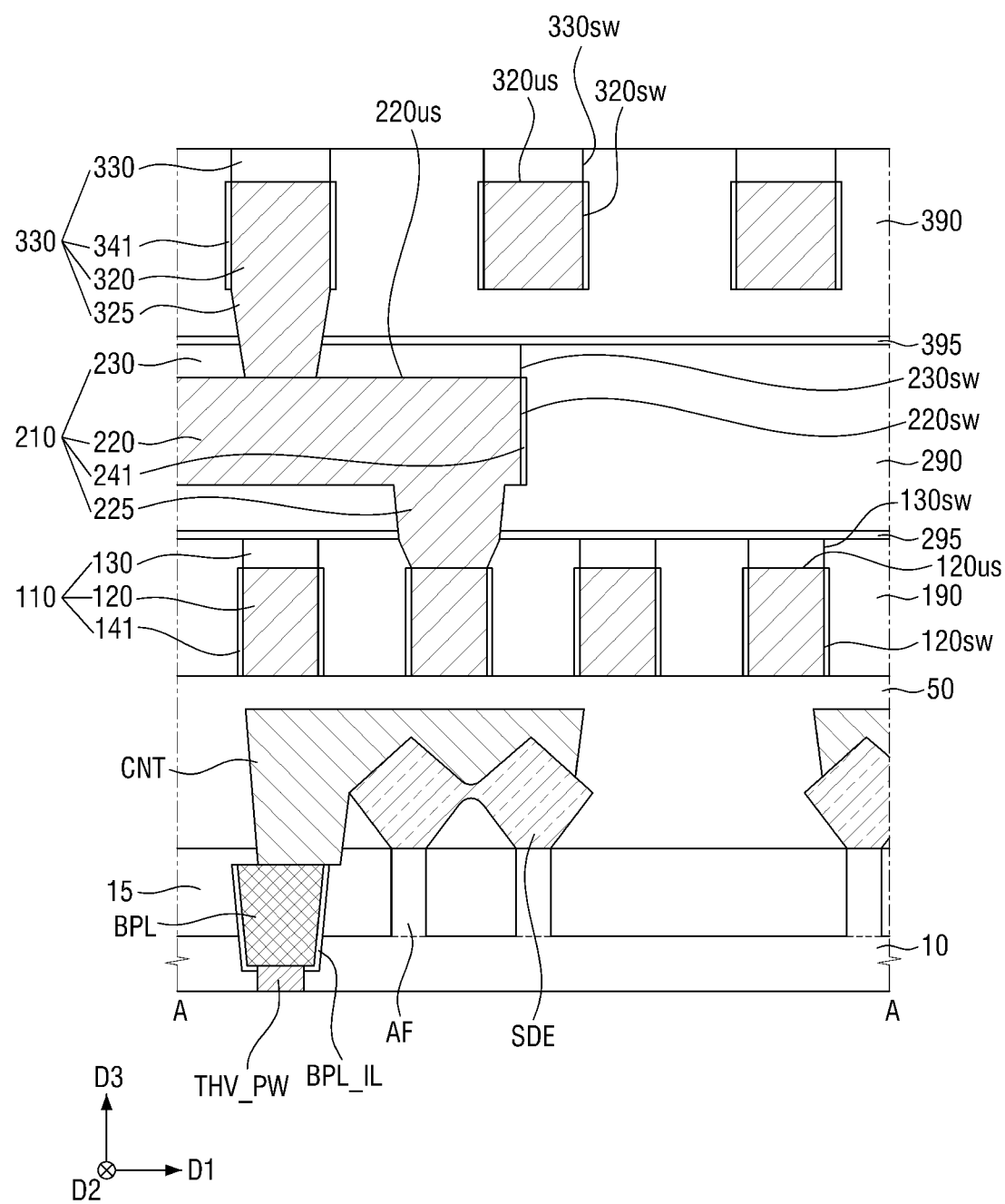
FIG. 18 is a diagram for explaining a semiconductor device, according to example embodiments.

FIG. 18 is a diagram for explaining a semiconductor device according to example embodiments. For convenience of explanation, points different from those explained using FIG. 17 will be mainly explained.

Referring to FIG. 18, the semiconductor device according to example embodiments may further include a power penetration via THV_PW that penetrates the substrate 10.

The source/drain contact CNT may be connected to the buried power rail BPL. For example, the source/drain contact CNT may contact the buried power rail BPL.

The power penetration via THV_PW may penetrate the substrate 10 and be connected to the buried power rail BPL. For example, the power penetration via THV_PW may contact a lower surface of the buried power rail BPL. The buried power rail BPL may be supplied with power through the power penetration via THV_PW.

Although not shown, a pad connected to the power penetration via THV_PW may be formed on the lower surface of the substrate 10. Here, the first level wiring 110 may be disposed on the upper surface of the substrate 10. The lower surface of the substrate 10 may be a surface opposite to the upper surface of the substrate 10.

Figure 19:
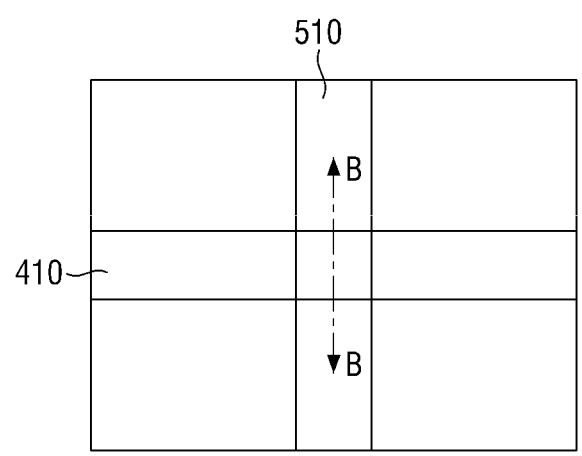
FIG. 19 is a layout view for explaining a semiconductor device, according to example embodiments.
Figure 19:
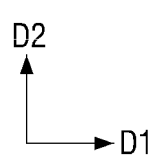
Figure 20:
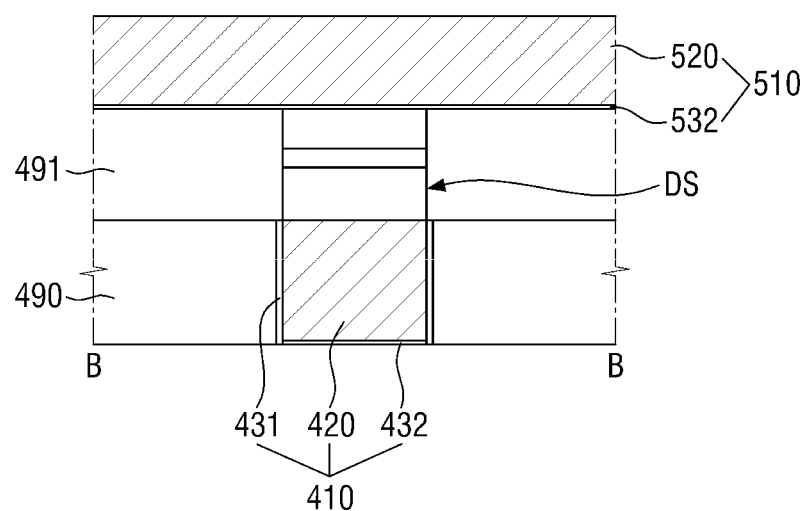
FIG. 20 is an exemplary cross-sectional view taken along a line B-B of FIG. 19.

FIG. 19 is a layout view for explaining a semiconductor device according to example embodiments. FIG. 20 is an exemplary cross-sectional view taken along a line B-B of FIG. 19.

Referring to FIGS. 19 and 20, a semiconductor device according to example embodiments may include a fourth level wiring 410, a fifth level wiring 510, and an information storage pattern DS.

The fourth level wiring 410 may be disposed in the fourth interlayer insulating film 490. The fourth level wiring 410 may extend lengthwise in the first direction D1.

The fourth level wiring 410 may include a fourth line wiring 420, a fourth side wall graphene film 431, and a fourth bottom graphene film 432.

The fourth bottom graphene film 432 may extend along the bottom surface of the fourth line wiring 420. The fourth side wall graphene film 431 may extend along the side walls of the fourth line wiring 420.

Explanation of the fourth line wiring 420, the fourth side wall graphene film 431, and the fourth bottom graphene film 432 may be similar to explanation of the first line wiring 120, the first side wall graphene film 141 and the first bottom graphene film 142 explained in FIG. 2.

The fifth level wiring 510 may extend lengthwise in the second direction D2. The fifth level wiring 510 may include a fifth line wiring 520 and a fifth bottom graphene film 532. Although not shown, the fifth level wiring 510 may include a fifth side wall graphene film that extends along the side walls extending in the second direction D2.

The fifth bottom graphene film 532 may extend along a bottom surface of the fifth line wiring 520.

Explanation of the fifth line wiring 520, the fifth side wall graphene film, and the fifth bottom graphene film 532 may be similar to explanation of the first line wiring 120, the first side wall graphene film 141 and the first bottom graphene film 142 explained in FIG. 2.

The information storage pattern DS may be disposed between the fourth level wiring 410 and the fifth level wiring 510. The information storage pattern DS may be disposed in the fifth interlayer insulating film 491.

The information storage pattern DS may be memory elements that may store data. The information storage pattern DS may include a memory pattern using a magnetic tunnel junction pattern or a memory pattern using a variable resistor including a phase change material.

Figure 21:
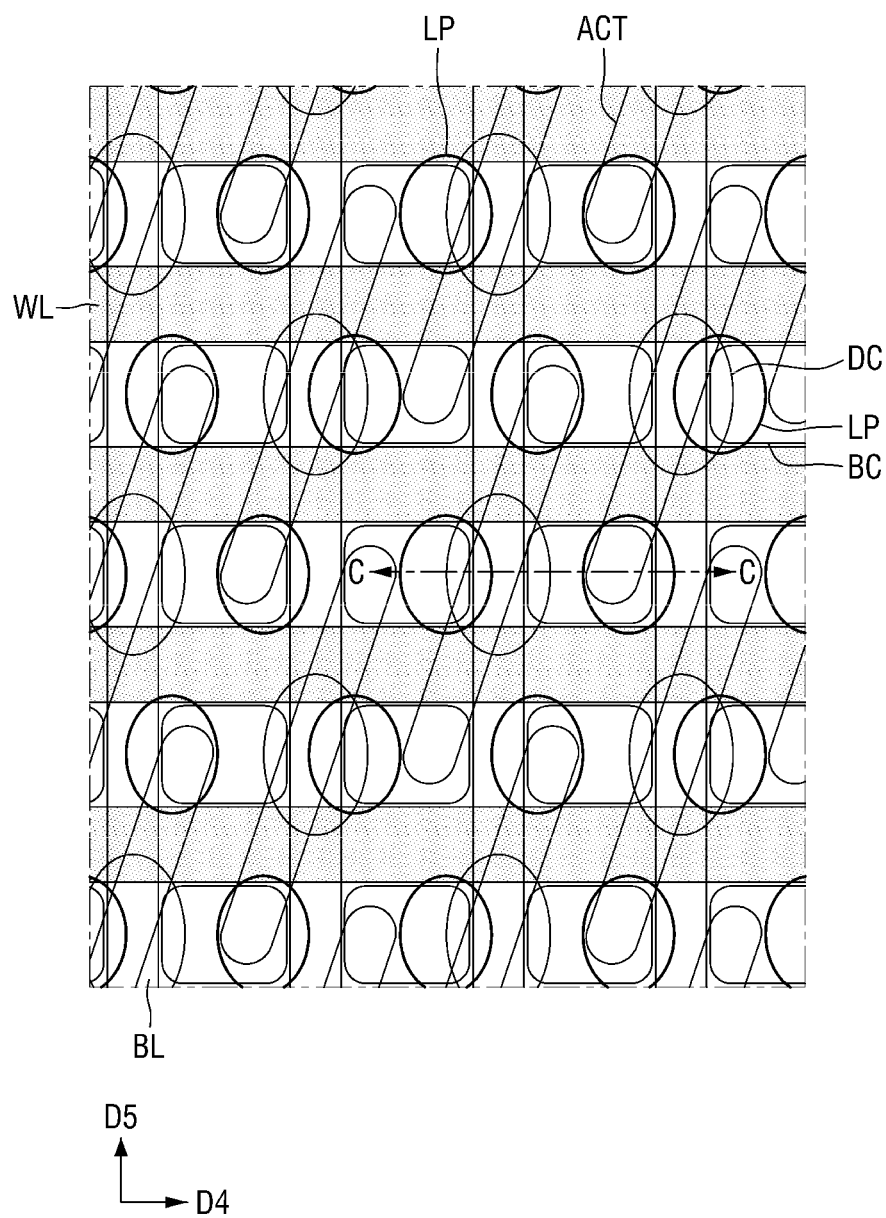
FIG. 21 is a schematic layout of a semiconductor device, according to example embodiments.
Figure 22:
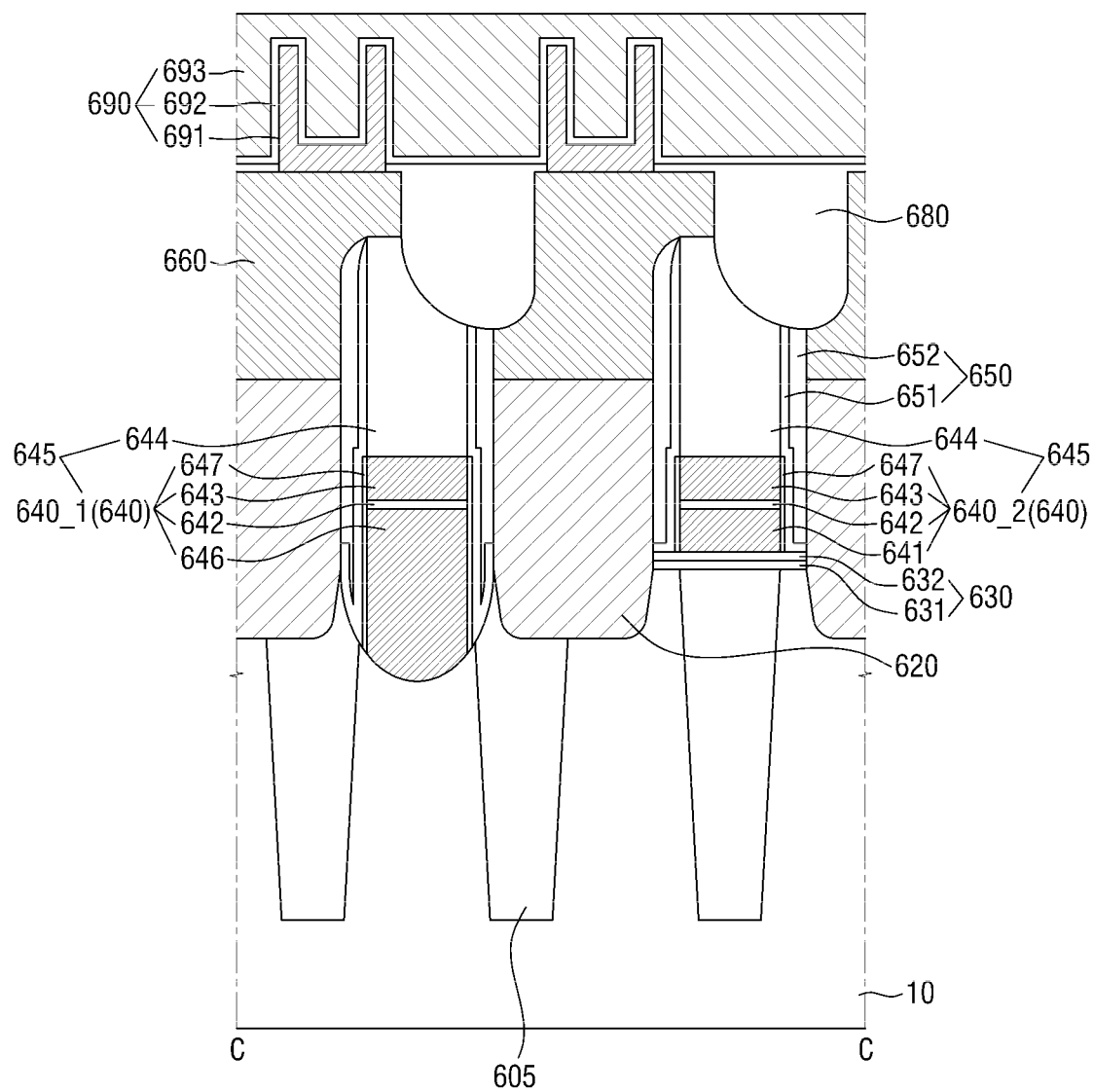
FIG. 22 is a cross-sectional view taken along a line C-C of FIG. 21.

FIG. 21 is a schematic layout view of a semiconductor device according to example embodiments of the present disclosure. FIG. 22 is a cross-sectional view taken along a line C-C of FIG. 21.

In the drawings of the semiconductor devices according to example embodiments of the present disclosure, although a DRAM (Dynamic Random Access Memory) is shown as an example, the embodiment is not limited thereto.

Referring to FIG. 21, the semiconductor device according to example embodiments of the present disclosure may include a plurality of active regions ACT. The active regions ACT may be defined by an element separation film (e.g., element separation film 605 of FIG. 22) formed in the substrate (e.g., substrate 10 of FIG. 22).

As shown, the active region ACT may be disposed in a bar shape of a diagonal line or an oblique line with a decrease in design rule of the semiconductor device.

A plurality of gate electrodes may be disposed on the active region ACT in a fourth direction D4 across the active region ACT. The plurality of gate electrodes may extend to be parallel with each other. The plurality of gate electrodes may be, for example, a plurality of word lines WL.

The word lines WL may be disposed at equal intervals. The width of the word lines WL or the interval between the word lines WL may be determined depending on the design rules.

A plurality of bit lines BL extending in a fifth direction D5 orthogonal to the word line WL may be disposed on the word line WL. The plurality of bit lines BL may extend to be parallel with each other.

The bit lines BL may be disposed at equal intervals. The width of the bit line BL or the interval between the bit lines BL may be determined depending on the design rules.

The semiconductor device according to example embodiments may include various contact arrangements formed on the active region ACT. Various contact arrangements may include, for example, a direct contact DC, a buried contact BC, a landing pad LP, and the like.

Here, the direct contact DC may mean a contact that electrically connects the active region ACT to the bit line BL. The buried contact BC may mean a contact that connects the active region ACT to a lower electrode (e.g., lower electrode 691 of FIG. 22) of the capacitor.

Due to the arrangement structure, a contact area between the buried contact BC and the active region ACT may be small. Accordingly, a conductive landing pad LP may be introduced to increase the contact area with the active region ACT and to increase the contact area with the lower electrode (e.g., lower electrode 691 of FIG. 22) of the capacitor.

The landing pad LP may be disposed between the active region ACT and the buried contact BC, or may be disposed between the buried contact BC and the lower electrode of the capacitor. In the semiconductor device according to example embodiments of the present disclosure, the landing pad LP may be disposed between the buried contact BC and the lower electrode of the capacitor. By increasing the contact area through introduction of the landing pad LP, the contact resistance between the active region ACT and the capacitor lower electrode may be reduced.

In the semiconductor device according to example embodiments of the present disclosure, the direct contact DC may be disposed in a central portion of the active region ACT. The buried contacts BC may be disposed at both ends of the active region ACT.

As the buried contacts BC are disposed at both ends of the active region ACT, the landing pads LP may be disposed to partially overlap the buried contacts BC to be adjacent to both ends of the active region ACT.

Explained in another way, the buried contact BC may be formed to overlap the active region ACT between adjacent word lines WL and between adjacent bit lines BL and the element separation film (e.g., element separation film 605 of FIG. 22).

The word line WL may be formed as a structure buried in the substrate 10. The word line WL may be disposed across the active region ACT between the direct contact DC and the buried contact BC.

As shown, two word lines WL may be disposed to cross one active region ACT. Since the active regions ACT is arranged in a diagonal form, the word line WL may have an angle of less than 90 degrees with the active region ACT.

The direct contact DC and the buried contact BC may be symmetrically disposed. Accordingly, the direct contact DC and the buried contact BC may be disposed on a straight line along the fourth direction D4 and the fifth direction D5.

On the other hand, unlike the direct contact DC and the buried contact BC, the landing pad LP may be disposed in a zigzag shape in the fifth direction D5 in which the bit line BL extends. Also, the landing pad LP may be disposed to overlap the same side surface portion of each bit line BL in the fourth direction D4 in which the word line WL extends.

For example, each landing pad LP of the first line may overlap a left side surface of the corresponding bit line BL, and each landing pad LP of the second line may overlap a right side surface of the corresponding bit line BL.

Referring to FIGS. 21 and 22, the semiconductor devices according to example embodiments may include an element separation film 605, a plurality of wiring conductive films 640, a bit line contact 646, a storage contact 620, and an information storage 690.

The element separation film 605 may be formed in the substrate 100. The element separation film 605 may have an STI (shallow trench isolation) structure having excellent element separation characteristics. The element separation film 605 may define an active region ACT in the substrate 10. The element separation film 605 may include, for example, at least one of a silicon oxide film, a silicon nitride film, and a silicon oxynitride film.

The wiring conductive film 640 may intersect the element separation film 605 and the active region ACT defined by the element separation film 605. For example, one wiring conductive film 640 may be formed on the substrate 10 and the element separation film 605 disposed in a direction D5 in which the wiring conductive film 640 extends. The wiring conductive film 640 may be formed to intersect the word line WL of FIG. 1. Here, the wiring conductive film 640 may correspond to the bit line BL.

The wiring conductive film 640 may be multi-films. The wiring conductive film 640 may include, for example, a first conductive film 641, a second conductive film 642, a third conductive film 643, and a sixth side wall graphene film 647. The first to third conductive films 641, 642, and 643 may be sequentially stacked on the substrate 10 and the element separation film 605. The sixth side wall graphene film 647 may extend along the side walls of the first to third conductive films 641, 642, and 643.

Each of the first to third conductive films 641, 642, and 643 may include, for example, at least one of an impurity-doped semiconductor material, a conductive silicide compound, a conductive metal nitride, and a metal. For example, although the first conductive film 641 includes a doped semiconductor material, the second conductive film 642 includes a conductive silicide compound, and the third conductive film 643 may include at least one of a conductive metal nitride and a metal, the embodiment is not limited thereto. In the semiconductor device according to some embodiments, the third conductive film 643 may include a metal and may include ruthenium (Ru). The sixth side wall graphene film 647 may include graphene.

The bit line contact 646 may be formed between the wiring conductive film 640 and the substrate 100. That is, the wiring conductive film 640 may be formed on the bit line contact 646.

For example, the bit line contact 646 may be formed at a point on which the wiring conductive film 140 intersects a central portion of the active region ACT having a long island shape. The bit line contact 646 may be formed between the substrate 10 of the central portion of the active region ACT and the wiring conductive film 640.

The bit line contact 646 may electrically connect the wiring conductive film 640 and the substrate 10. Here, the bit line contact 646 may correspond to the direct contact DC. The sixth side wall graphene film 647 may extend along the side walls of the bit line contact 646.

The bit line contact 646 may include, for example, at least one of a semiconductor material doped with impurities, a conductive silicide compound, a conductive metal nitride, and a metal.

In FIG. 22 which is a cross-sectional view taken along the fourth direction D4 between the adjacent word lines WL of FIG. 21, one of adjacent first and second wiring conductive films 640_1 and 640_2 may be formed on the element separation film 605, and the other thereof may be formed on the substrate 10 which is an active region ACT defined by the element separation film 605. In the cross-sectional view taken in the fourth direction D4, the active region ACT included in the element separation film 605 and the substrate 10 may be disposed between the adjacent first and second wiring conductive films 640_1 and 640_2.

The second wiring conductive film 640_2 on the element separation film 605 in which the bit line contact 646 is not formed may include first to third conductive films 641, 642, and 643 and the sixth side wall graphene film 647. The first wiring conductive film 640_1 on the substrate 10 on which the bit line contact 646 is formed may include, for example, a second conductive film 642, a third conductive film 643 and a sixth side wall graphene film 647. A part of the bit line contact 646 may be disposed at a position where the first conductive film 641 of the second wiring conductive film 640_2 is formed.

On the other hand, in the first wiring conductive film 640_1 extending lengthwise in the fifth direction D5, the first wiring conductive film 640_1 on the element separation film 605 in which the bit line contact 646 is not formed may include first to third conductive films 641, 642, and 643, like the second wiring conductive film 640_2.

A wiring capping film 644 is disposed on the wiring conductive film 640 and may extend lengthwise in the fifth direction D5. At this time, the wiring capping film 644 may include, but is not limited to, a silicon nitride film.

The wiring conductive film 640 and the wiring capping film 644 may be included in the bit line structure 645. A space between the adjacent bit line structures 645 may vertically overlap the substrate 10 and the element separation film 605.

A cell insulating film 630 may be formed on the substrate 10 and the element separation film 605. More specifically, the cell insulating film 630 may be formed on the substrate 10 in which the bit line contact 646 is not formed and the element separation film 605. The cell insulating film 630 may be formed between the substrate 10 and the wiring conductive film 640, and between the element separation film 605 and the wiring conductive film 640.

Although the cell insulating film 630 may be a single film, as shown, the cell insulating film 630 may be multi-films including a first cell insulating film 631 and a second cell insulating film 632. For example, the first cell insulating film 631 may include an oxide film, and the second cell insulating film 632 may include a nitride film, but are not limited thereto.

A wiring spacer 650 may be disposed on the side walls of the wiring conductive film 640 and the wiring capping film 644. Although the wiring spacer 650 may be a single film, as shown, the wiring spacer 650 may be multi-films including a first spacer 651 and a second spacer 652. For example, the first and second spacers 651 and 652 may include, but is not limited to, one of a silicon oxide film, a silicon nitride film, a silicon oxynitride film, a silicon oxycarbonitride film, air, and a combination thereof.

The storage contact 620 may be formed between the adjacent wiring conductive films 640. The storage contact 620 may overlap the substrate 10 and the element separation film 605 between the adjacent wiring conductive films 640. Here, the storage contact 620 may correspond to the buried contact BC.

The storage contact 620 may include, for example, at least one of a semiconductor material doped with impurities, a conductive silicide compound, a conductive metal nitride, and a metal.

A storage pad 660 may be formed on the storage contact 620. The storage pad 660 may be electrically connected to the storage contact 620. Here, the storage pad 660 may correspond to the landing pad LP.

The storage pad 660 may overlap a part of the upper surface of the bit line structure 645. The storage pad 660 may include, for example, at least one of a semiconductor material doped with impurities, a conductive silicide compound, a conductive metal nitride, and a metal.

A pad separation insulating film 680 may be formed on the storage pad 660 and the bit line structure 645. The pad separation insulating film 680 may define a region of the storage pad 660 which forms a plurality of isolated regions. Also, the pad separation insulating film 680 may be patterned to expose a part of the upper surface of the storage pad 660.

The pad separation insulating film 680 includes the insulating material, and may electrically separate the plurality of storage pads 660 from each other. For example, the pad separation insulating film 680 may include, but is not limited to, one of a silicon oxide film, a silicon nitride film, a silicon oxynitride film and a combination thereof.

The information storage 690 may be formed on the pad separation insulating film 680. The information storage 690 may be electrically connected to the storage pad 660. That is, the information storage 690 may be electrically connected to the storage contact 620.

The information storage 690 may include, for example but is not limited to, a capacitor. The information storage 690 includes a lower electrode 691, a capacitor insulating film 692, and an upper electrode 693.

The lower electrode 691 is shown as having a cylindrical shape, but is not limited thereto. The lower electrode 691 may, of course, have a pillar shape.

FIGS. 23 to 31 are intermediate stage diagrams for explaining a method for fabricating a semiconductor device according to example embodiments.

Figure 23:
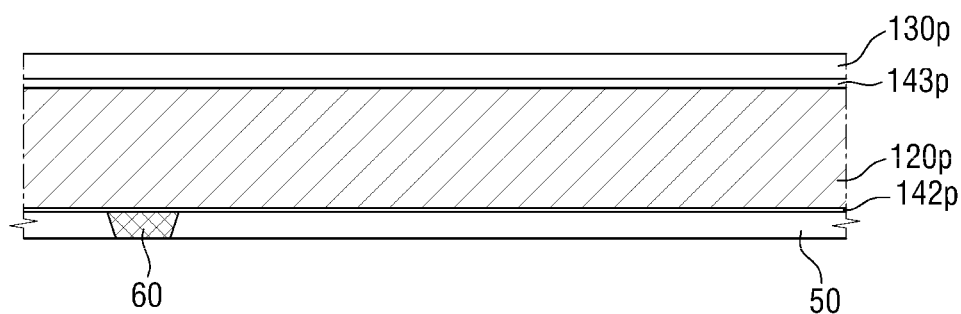
FIGS. 23 to 31 are intermediate stage diagrams for explaining a method for fabricating a semiconductor device, according to example embodiments.
Figure 23:
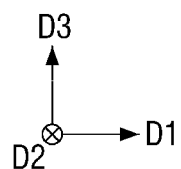

Referring to FIG. 23, a first_1 graphene film 142p, a first ruthenium film 120p, a first_2 graphene film 143p, and a first hard mask film 130p may be sequentially formed on the lower interlayer insulating film 50 on which the lower conductive pattern 60 is disposed.

The first ruthenium film 120p may be in contact with the first_1 graphene film 142p and the first_2 graphene film 143p.

The first_2 graphene film 143p may protect the first ruthenium film 120p, while the first hard mask film 130p is deposited on the first ruthenium film 120p.

As shown in FIG. 15, the lower interlayer insulating film 50 may be disposed on the substrate (e.g., substrate 10 of FIG. 15).

Unlike the illustrated example, one of the first_1 graphene film 142p or the first_2 graphene film 143p may not be formed. Alternatively, both the first_1 graphene film 142p and the first_2 graphene film 143p may not be formed.

Figure 24:
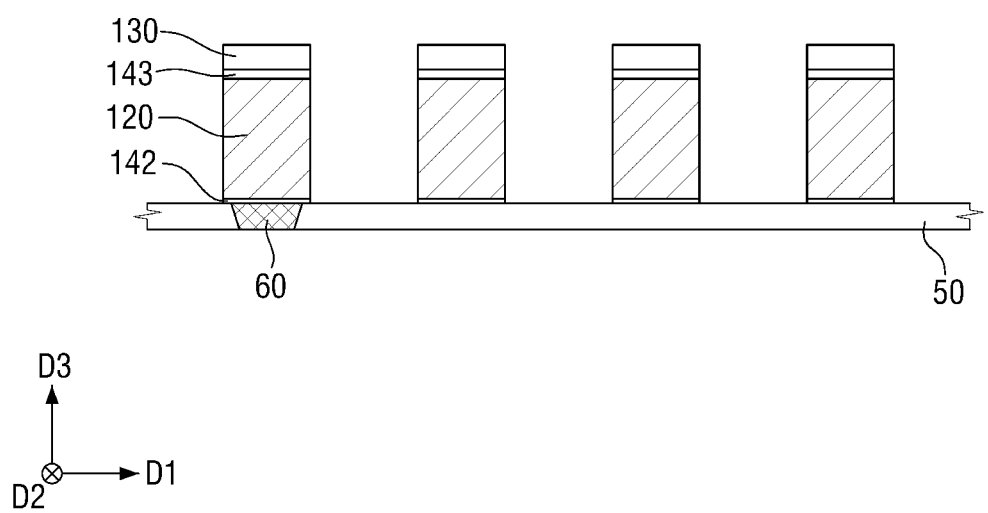

Referring to FIG. 24, the first_1 graphene film 142p, the first ruthenium film 120p, the first_2 graphene film 143p, and the first hard mask film 130p may be patterned through an etching process.

More specifically, an etching mask may be formed on the first hard mask film 130p. The first_1 graphene film 142p, the first ruthenium film 120p, the first_2 graphene film 143p, and the first hard mask film 130p may be partially removed, using the etching mask.

As a result, the first bottom graphene film 142, the first line wiring 120, the first upper surface graphene film 143, and the first insulating capping film 130 may be formed on the lower interlayer insulating film 50. For example, the first line wiring 120 may be a ruthenium line wiring.

After the etching process, an oxide of metal included in the first line wiring 120 may be formed on the side walls of the first line wiring 120. The metal oxide formed on the side walls of the first line wiring 120 may degrade the characteristics of the first line wiring 120.

In order to prevent the characteristic degradation of the first line wiring 120, a reducing process of reducing the surface of the first line wiring 120 may be performed after the etching process of forming the first line wiring 120.

The reducing process of reducing the surface of the first line wiring 120 may be, for example, at least one of a heat treatment process using a reducing gas, a high-temperature plasma process using a reducing gas, and a radical process using a reducing gas. For example, the reducing gas may include, but is not limited to, hydrogen ($H_2$).

As an example, the etching process of forming the first line wiring 120 and the reducing process of reducing the surface of the first line wiring 120 may be performed in-situ. As another example, the etching process of forming the first line wiring 120 and the reducing process of reducing the surface of the first line wiring 120 may be performed ex-situ.

Since the first upper surface graphene film 143 and/or the first line wiring 120 may deteriorate while the first insulating capping film 130 is removed, the first insulating capping film 130 is left without being removed.

Figure 25:
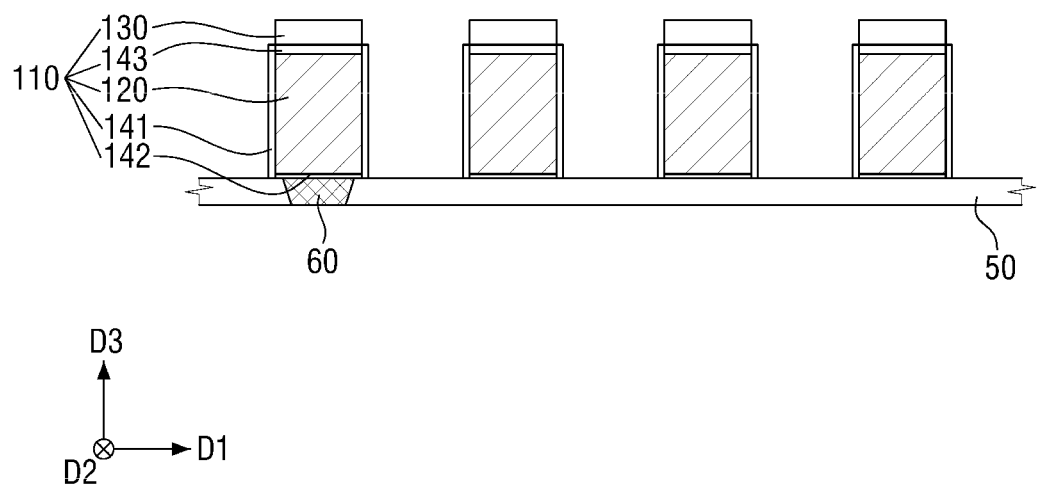

Referring to FIG. 25, the first side wall graphene film 141 may be formed on the side walls of the first line wiring 120.

The first side wall graphene film 141 may extend along the side walls of the first line wiring 120. The first side wall graphene film 141 may not be formed on the side walls of the first insulating capping film 130.

As an example, the first side wall graphene film 141 may be selectively formed on the side walls of the first line wiring 120. As another example, the first side wall graphene film 141 may be entirely formed along the side walls of the first line wiring 120 and the upper surface of the lower interlayer insulating film 50. After that, except for the first side wall graphene film 141 formed on the side walls of the first line wiring 120, the first bottom graphene film 142, and the first upper surface graphene film 143, the remaining first side wall graphene film 141 may become a non-conductor or be selectively removed.

As an example, the deposition process of the first side wall graphene film 141 and the reducing process of reducing the surface of the first line wiring 120 (see FIG. 24) may be performed in-situ. As another example, the deposition process of the first side wall graphene film 141 and the reducing process of reducing the surface of the first line wiring 120 may be performed ex-situ.

Figure 26:
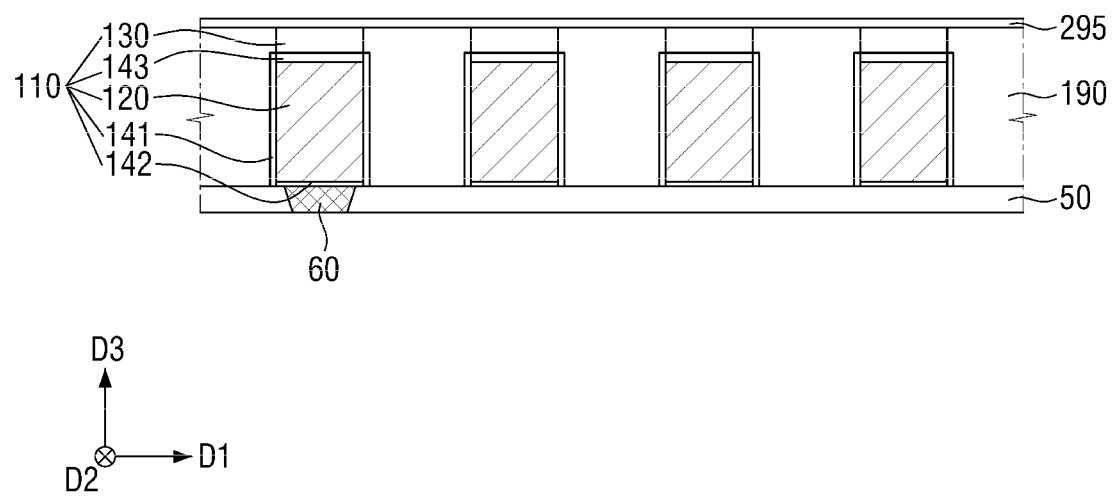

Referring to FIG. 26, the first interlayer insulating film 190 which covers the first side wall insulating film 141 may be formed on the lower interlayer insulating film 50.

The upper surface of the first interlayer insulating film 190 may be disposed on the same plane as the upper surface of the first insulating capping film 130.

The second etching stop film 295 may be formed along the upper surface of the first interlayer insulating film 190 and the upper surface of the first insulating capping film 130.

Figure 27:
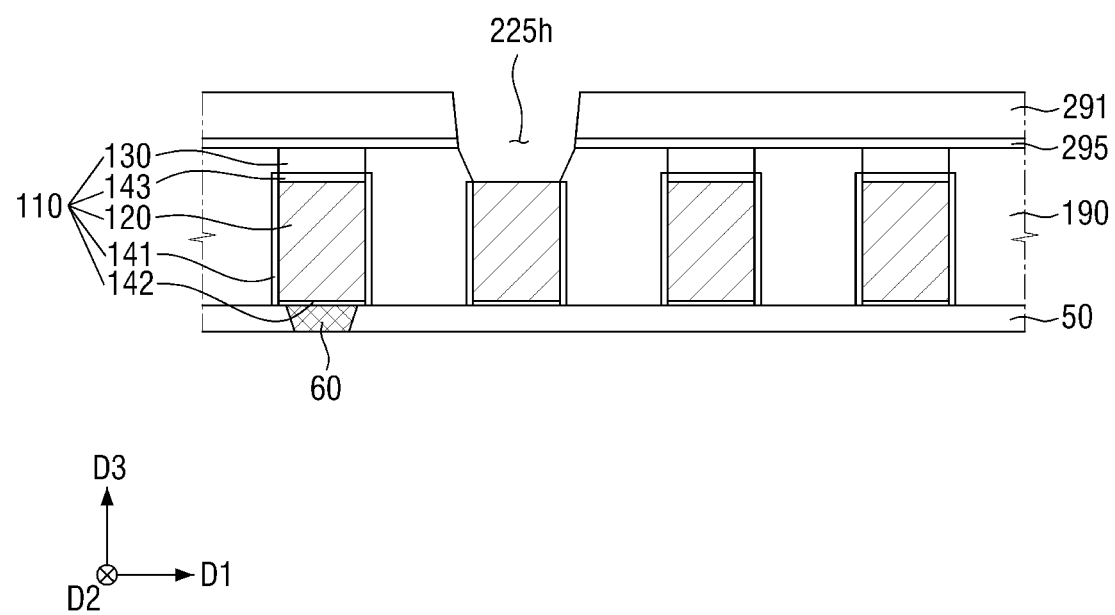

Referring to FIG. 27, a second pre interlayer insulating film 291 may be formed on the second etching stop film 295.

Next, a via hole 225h may be formed in the second pre interlayer insulating film 291 and the second etching stop film 295. The via hole 225h may penetrate the second pre interlayer insulating film 291 and the second etching stop film 295. The via hole 225h may also penetrate the first insulating capping film 130.

Figure 28:
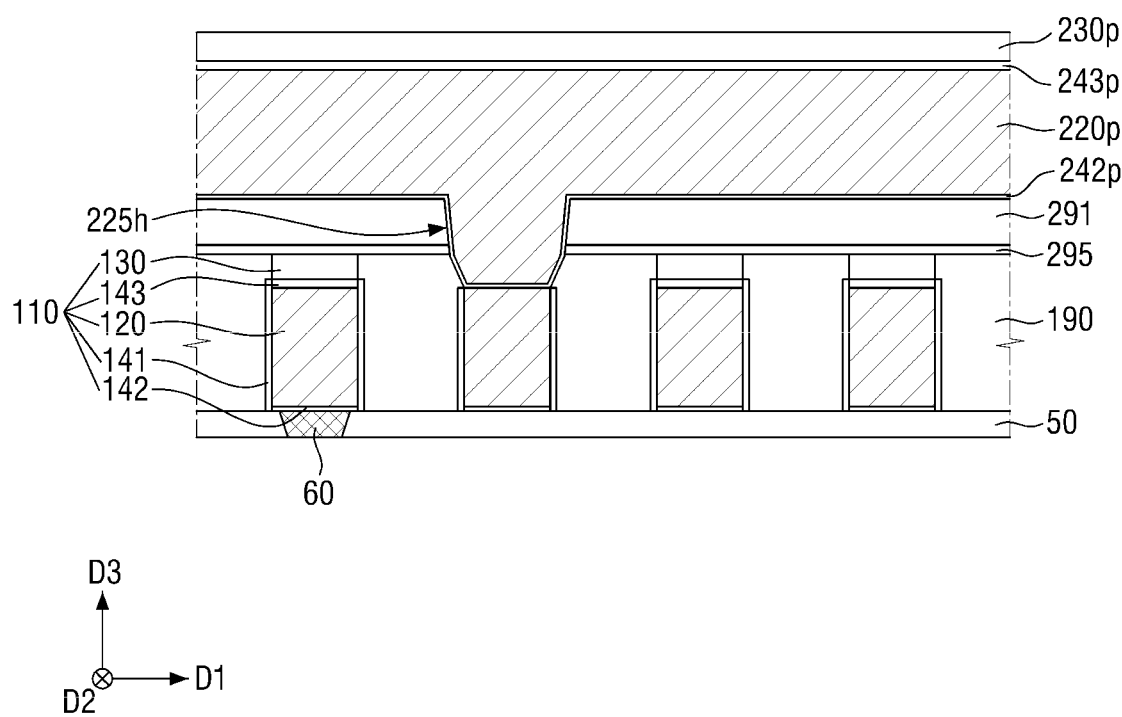

Referring to FIG. 28, a second_1 graphene film 242p may be formed along the upper surface of the second pre interlayer insulating film 291 and the side wall and bottom surface of the via hole 225h.

A second ruthenium film 220p may be formed on the second_1 graphene film 242p. The second ruthenium film 220p fills the via hole 225h, and may extend along the upper surface of the second pre interlayer insulating film 291. A second_2 graphene film 243p and a second hard mask film 230p may be sequentially formed on the second ruthenium film 220p.

Unlike the illustrated example, one of the second_1 graphene film 242p and the second_2 graphene film 243p may not be formed. Or, both the second_1 graphene film 242p and the second_2 graphene film 243p may not be formed.

Figure 29:
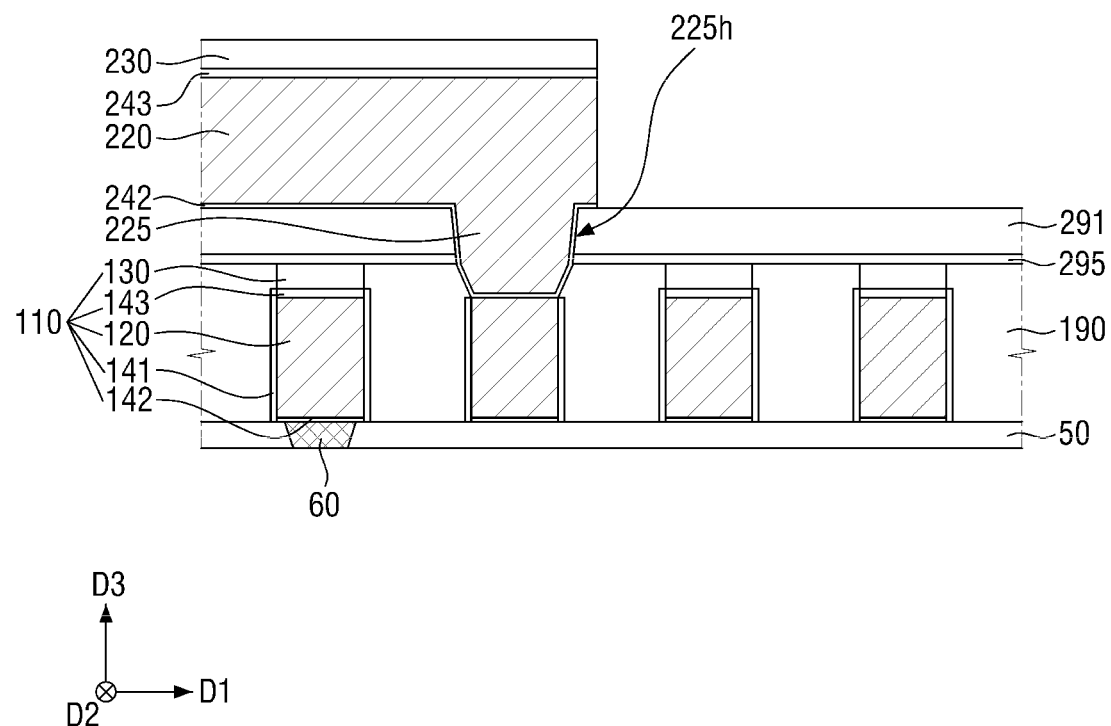

Referring to FIG. 29, the second_1 graphene film 242p, the second ruthenium film 220p, the second_2 graphene film 243p, and the second hard mask film 230p may be patterned through the etching process.

As a result, the second bottom graphene film 242, the second via 225, the second line wiring 220, the second upper surface graphene film 243, and the second insulating capping film 130 may be formed on the first interlayer insulating film 190. For example, the second line wiring 220 may be a ruthenium line wiring. The second via 225 fills the via hole 225h.

After the etching process of forming the second line wiring 220, the reducing process of reducing the surface of the second line wiring 220 may be performed.

Figure 30:
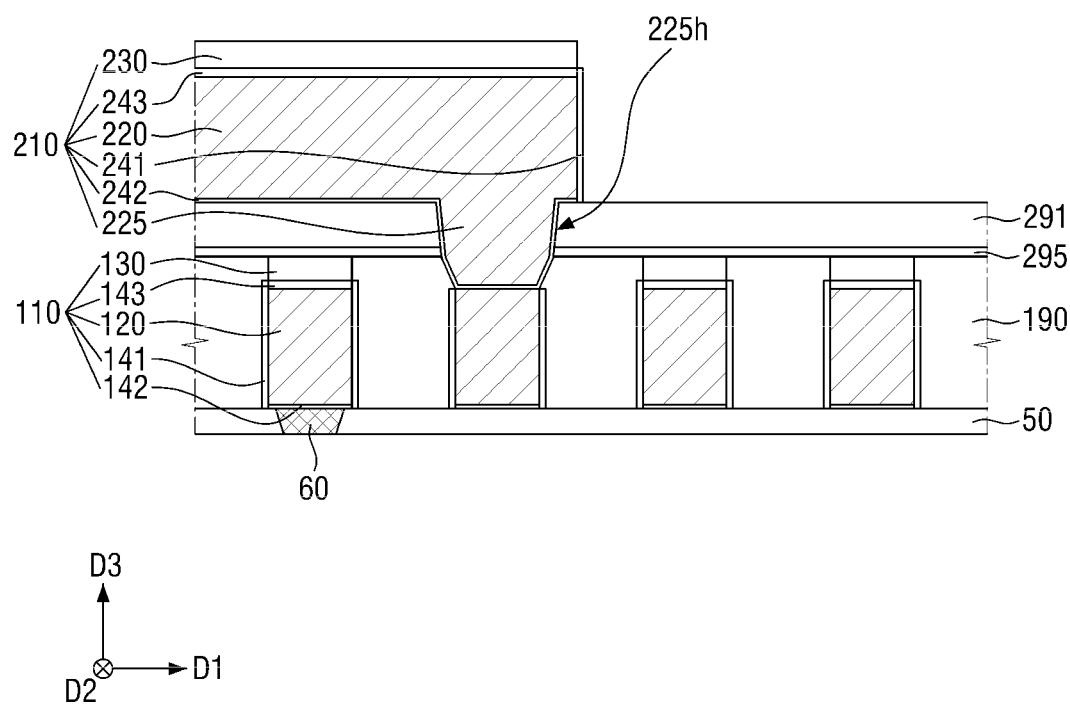

Referring to FIG. 30, the second side wall graphene film 241 may be formed on the side walls of the second line wiring 220. The second side wall graphene film 241 may extend along the side wall of the second line wirings 220. The second side wall graphene film 241 may not be formed on the side wall of the second insulating capping film 230.

As a result, the second level wiring 210 may be formed on the first level wiring 110.

Figure 31:
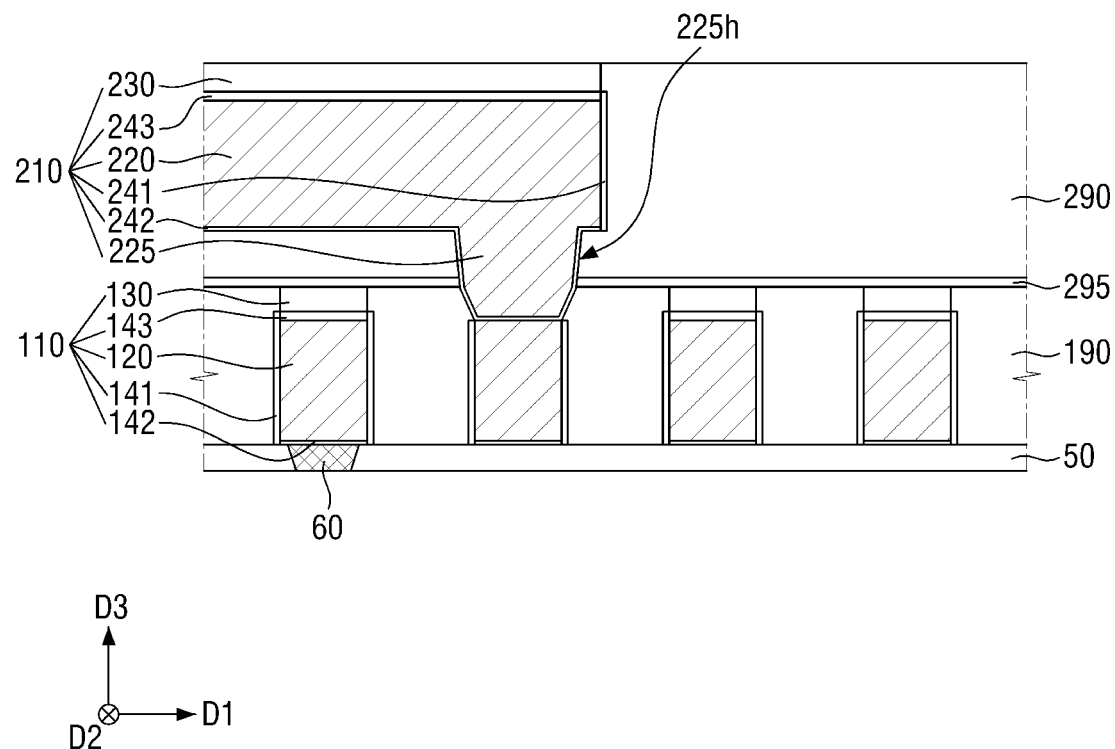

Referring to FIG. 31, after forming the second level wiring 210, an additional interlayer insulating film may be formed on the second pre interlayer insulating film (e.g., second pre interlayer insulating film 291 of FIG. 30). As a result, the second interlayer insulating film 290 may be formed on the second etching stop film 295.

The second interlayer insulating film 290 may cover the second side wall graphene film 241. The upper surface of the second interlayer insulating film 290 may be disposed on the same plane as the upper surface of the second insulating capping film 230. Subsequently, a third level wiring (e.g., third level wiring 310 of FIG. 4) may be formed on the second level wiring 210.

In concluding the detailed description, those skilled in the art will appreciate that many variations and modifications may be made to the disclosed embodiments without substantially departing from the principles of the present inventive concept. Therefore, the disclosed embodiments of the disclosure are used in a generic and descriptive sense only and not for purposes of limitation.

What is claimed is:

1. A semiconductor device comprising:
a first level wiring disposed at a first metal level, the first level wiring including a first line wiring, a first insulating capping film, and a first side wall graphene film, the first insulating capping film extending along and contacting an upper surface of the first line wiring, and the first side wall graphene film extending along and contacting a side wall of the first line wiring;
an interlayer insulating film which covers the side wall of the first line wiring and a side wall of the first insulating capping film; and
a second level wiring disposed at a second metal level higher than the first metal level, the second level wiring including a second via connected to the first line wiring, and a second line wiring connected to the second via,
wherein the second via penetrates the first insulating capping film,
wherein the interlayer insulating film contacts the side wall of the first insulating capping film, and
wherein the first insulating capping film does not extend along an upper surface of the interlayer insulating film.

2. The semiconductor device of claim 1, wherein the first level wiring further includes a first bottom graphene film extending along a bottom surface of the first line wiring.

3. The semiconductor device of claim 1, wherein the first level wiring further includes a first upper surface graphene film extending along an upper surface of the first line wiring between the first line wiring and the first insulating capping film.

4. The semiconductor device of claim 1,
wherein the second level wiring further includes a second side wall graphene film extending along a side wall of the second line wiring, and a second insulating capping film extending along an upper surface of the second line wiring, and
wherein the second line wiring and the second via have an integral structure.

5. The semiconductor device of claim 4, further comprising:
a third level wiring disposed at a third metal level between the first metal level and the second metal level, the third level wiring including a third line wiring and a third via,
the second via being directly connected to the first level wiring.

6. The semiconductor device of claim 1,
wherein the second line wiring includes a wiring filling film, and a wiring barrier film extending along a side wall and a bottom surface of the wiring filling film,
wherein the wiring barrier film includes a conductive material including a metal, and
wherein a material included in the wiring filling film is different from a material included in the first line wiring.

7. The semiconductor device of claim 6, further comprising:
a third level wiring disposed at a third metal level higher than the second metal level,
wherein the third level wiring includes a third line wiring connected to the second line wiring, a third insulating capping film extending along an upper surface of the third line wiring, and a third side wall graphene film extending along a side wall of the third line wiring, and wherein the third line wiring includes the same material as the first line wiring.

8. The semiconductor device of claim 1, wherein the interlayer insulating film includes an air gap disposed on at least one side of the first level wiring.

9. The semiconductor device of claim 1,
wherein the first level wiring further includes a first via, and
wherein the first line wiring and the first via have an integral structure.

10. The semiconductor device of claim 9, further comprising:
a substrate disposed below the first level wiring; and
a buried power rail at least partially buried inside the substrate,
the first via being connected to the buried power rail.

11. The semiconductor device of claim 1, wherein the first line wiring includes ruthenium (Ru).

12. A semiconductor device comprising:
a first level wiring disposed at a first metal level, the first level wiring including a first line wiring, a first side wall graphene film, and a first bottom graphene film, the first bottom graphene film extending along and contacting a bottom surface of the first line wiring, and the first side wall graphene film extending along and contacting a side wall of the first line wiring; and
a second level wiring disposed at a second metal level higher than the first metal level, the second level wiring including a second via connected to the first line wiring, and a second line wiring connected to the second via,
wherein a thickness of the first side wall graphene film is greater than a thickness of the first bottom graphene film, and
wherein the first level wiring further includes a first upper surface graphene film extending along an upper surface of the first line wiring.

13. The semiconductor device of claim 12, wherein a thickness of the first upper surface graphene film is greater than or equal to a thickness of the first side wall graphene film.

14. The semiconductor device of claim 12,
wherein the second level wiring further includes a second side wall graphene film extending along a side wall of the second line wiring, and a second insulating capping film extending along an upper surface of the second line wiring, and
wherein the second line wiring and the second via have an integral structure.

15. The semiconductor device of claim 12,
wherein the second line wiring includes a wiring filling film, and a wiring barrier film extending along a side wall and a bottom surface of the wiring filling film,
wherein the wiring barrier film includes a conductive material including a metal, and
wherein a material included in the wiring filling film is different from a material included in the first line wiring.

16. The semiconductor device of claim 15, wherein the first line wiring includes ruthenium (Ru), and the wiring filling film includes copper (Cu).

17. A semiconductor device comprising:
a first level wiring disposed at a first metal level, the first level wiring including a first ruthenium line wiring, a first insulating capping film, a first side wall graphene film, and a first bottom graphene film, the first insulating capping film extending along an upper surface of the first ruthenium line wiring, the first side wall graphene film extending along a side wall of the first ruthenium line wiring, and the first bottom graphene film extending along a bottom surface of the first ruthenium line wiring;
an interlayer insulating film which covers a side wall of the first ruthenium line wiring and a side wall of the first insulating capping film; and
a second level wiring disposed at a second metal level higher than the first metal level, the second level wiring including a second via penetrating the first insulating capping film and connected to the first ruthenium line wiring, and a second line wiring connected to the second via,
wherein the interlayer insulating film contacts the side wall of the first insulating capping film, and
wherein the first insulating capping film does not extend along an upper surface of the interlayer insulating film.

18. The semiconductor device of claim 17, wherein a thickness of the first side wall graphene film is greater than a thickness of the first bottom graphene film.

19. The semiconductor device of claim 17, wherein the first level wiring further includes a first upper surface graphene film which extends along an upper surface of the first ruthenium line wiring, between the first ruthenium line wiring and the first insulating capping film.

* * * * *